(12) United States Patent
Nidhi et al.

(10) Patent No.: US 11,996,403 B2
(45) Date of Patent: May 28, 2024

(54) ESD DIODE SOLUTION FOR NANORIBBON ARCHITECTURES

(71) Applicant: Intel Corporation, Santa Clara, CA (US)

(72) Inventors: Nidhi Nidhi, Hillsboro, OR (US); Rahul Ramaswamy, Portland, OR (US); Walid M. Hafez, Portland, OR (US); Hsu-Yu Chang, Hillsboro, OR (US); Ting Chang, Portland, OR (US); Babak Fallahazad, Portland, OR (US); Tanuj Trivedi, Hillsboro, OR (US); Jeong Dong Kim, Scappoose, OR (US); Ayan Kar, Portland, OR (US); Benjamin Orr, Munich (DE)

(73) Assignee: Intel Corporation, Santa Clara, CA (US)

( * ) Notice: Subject to any disclaimer, the term of this patent is extended or adjusted under 35 U.S.C. 154(b) by 958 days.

(21) Appl. No.: 16/713,656

(22) Filed: Dec. 13, 2019

(65) Prior Publication Data

US 2021/0183850 A1  Jun. 17, 2021

(51) Int. Cl.
*H01L 27/02* (2006.01)
*H01L 29/06* (2006.01)
*H01L 29/66* (2006.01)

(52) U.S. Cl.
CPC ...... *H01L 27/0255* (2013.01); *H01L 29/0673* (2013.01); *H01L 29/66136* (2013.01)

(58) Field of Classification Search
CPC ......... H01L 29/66128; H01L 29/66136; H01L 29/8613; H01L 29/868; H01L 29/8611; H01L 29/66204; H01L 29/0673; H01L 29/42392; H01L 27/0255
See application file for complete search history.

(56) References Cited

U.S. PATENT DOCUMENTS

2014/0367782 A1* 12/2014 Cheng ................. H01L 29/6609
                                                                257/350
2020/0168715 A1*  5/2020 Wu ....................... H01L 27/088

* cited by examiner

*Primary Examiner* — Yara B Green
*Assistant Examiner* — Fakeha Sehar
(74) *Attorney, Agent, or Firm* — Schwabe, Williamson & Wyatt, P.C.

(57) ABSTRACT

Embodiments disclosed herein include semiconductor devices and methods of forming such devices. In an embodiment, a semiconductor device comprises a semiconductor substrate and a source. The source has a first conductivity type and a first insulator separates the source from the semiconductor substrate. The semiconductor device further comprises a drain. The drain has a second conductivity type that is opposite from the first conductivity type, and a second insulator separates the drain from the semiconductor substrate. In an embodiment, the semiconductor further comprises a semiconductor body between the source and the drain, where the semiconductor body is spaced away from the semiconductor substrate.

11 Claims, 20 Drawing Sheets

ESD DIODE SOLUTION FOR NANORIBBON ARCHITECTURES

TECHNICAL FIELD

Embodiments of the present disclosure relate to semiconductor devices, and more particularly to electrostatic discharge (ESD) diode solutions for nanoribbon and nanowire architectures.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

Various circuit elements other than transistors also need to be implemented in semiconductor devices. One such element is an electrostatic discharge (ESD) diode. Typically, such ESD diodes are formed with an N-well and a P-well in the semiconductor substrate. Such a configuration is suitable for fin-based devices, since the source and drain are electrically connected to the semiconductor substrate. However, in nanowire and nanoribbon devices, the source and drain are separated from the semiconductor substrate by an insulating layer. The nanoribbons and nanowires are also spaced away from the semiconductor substrate. Accordingly, N-wells and P-wells in the semiconductor substrate are not compatible with nanowire and nanoribbon-based architectures.

EMBODIMENTS OF THE PRESENT DISCLOSURE

Described herein are electrostatic discharge (ESD) diode solutions for nanoribbon and nanowire architectures, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension.

Figure 1A:
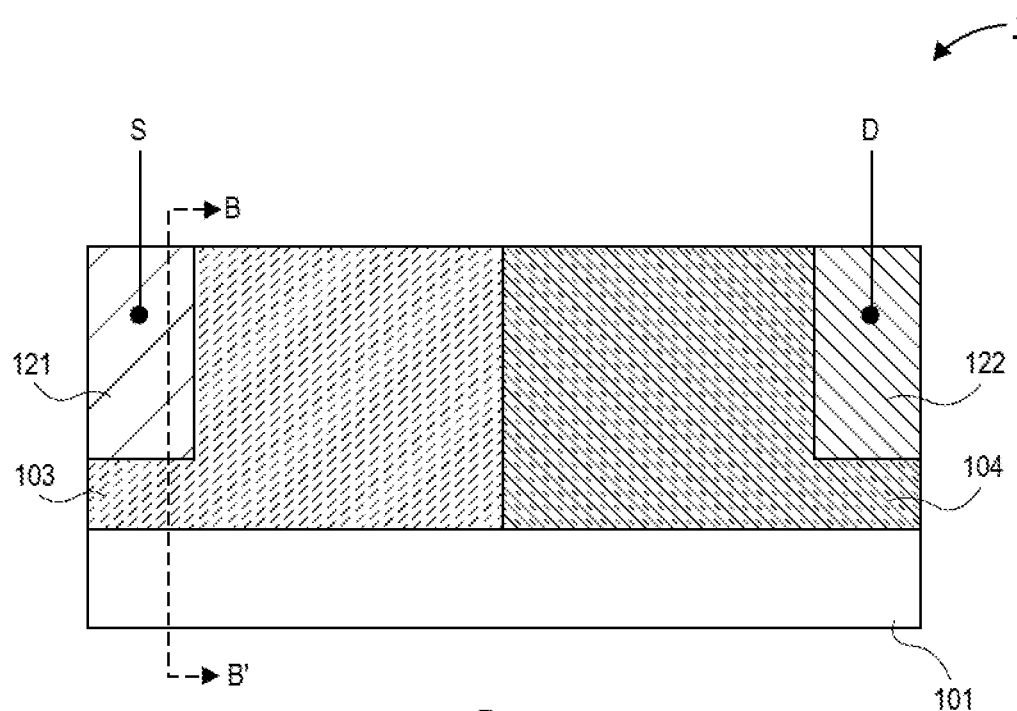
FIG. 1A is a cross-sectional illustration of an electrostatic discharge (ESD) diode in a fin-based architecture.
Figure 1B:
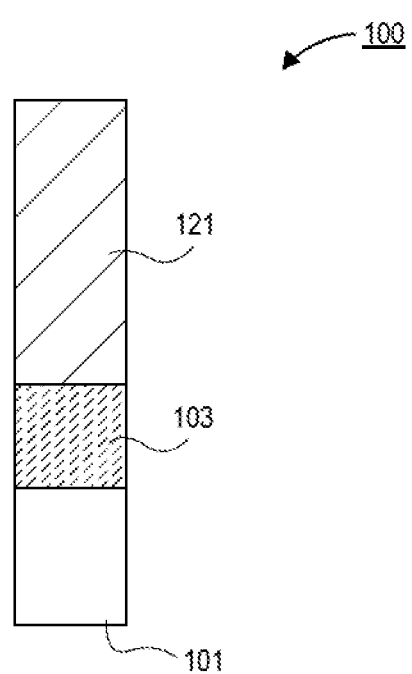
FIG. 1B is a cross-sectional illustration of the ESD diode in FIG. 1A along line B-B'.

As noted above, electrostatic discharge (ESD) diodes are typically formed with N-wells and P-wells in the semiconductor substrate. An example of such an ESD diode 100 implemented on a fin-based architecture is shown in FIGS. 1A and 1B. In the illustrated embodiment, a portion of a fin on a semiconductor substrate 101 is shown. A source region 121 and a drain region 122 are at opposite ends of the fin. An N-well 103 in the substrate 101 may be adjacent to the source region 121, and a P-well 104 in the substrate 101 may be adjacent to the drain region 122. Such a configuration provides the needed P-N junction because both the source region 121 and the drain region 122 are directly in contact with the substrate 101. For example, in FIG. 1B, the source region 121 is directly contacting the N-well 103 that is formed into the substrate 101.

However, such a configuration is not suitable for nanoribbon devices. Particularly, nanoribbon devices include a source and a drain that are electrically isolated from the substrate. For example, an insulating layer may separate the source and drain from the substrate. The channel regions (i.e., the nanoribbons) are directly connected to the source and the drain. As such, the channel regions do not have a direct connection to the underlying substrate either. Accordingly, N-wells and P-wells doped into the substrate are not able to be contacted by the source and drain. Therefore, alternative architectures are needed in order to provide a P-N junction or a P-I-N junction needed for ESD diodes in nanoribbon-based devices.

Embodiments disclosed herein include the formation of a P-N junction in the nanoribbons. In an embodiment, a first region of the nanoribbon is doped with N-type dopants and a second region of the nanoribbon is doped with P-type dopants. For example, when the source is N-type and the drain is P-type, the first region is adjacent to the source and the second region is adjacent to the drain. The P-N junction is provided where the first region meets the second region along the length of the nanoribbon.

Embodiments disclosed herein also include the formation of a P-I-N junction. In such embodiments, the source may be N-type, the drain may be P-type, and the nanoribbon may be an intrinsic semiconductor (i.e., I). At equilibrium (i.e., with zero voltage differential across the source and drain), the entire nanoribbon may be a depletion region. In other embodiments, the carrier concentration within the nanoribbon may be modulated by choice of work function material and/or gate dielectric surrounding the nanoribbon. Modulating the carrier concentration may narrow the depletion region and/or shift the depletion region towards either the source or the drain.

Figure 2A:
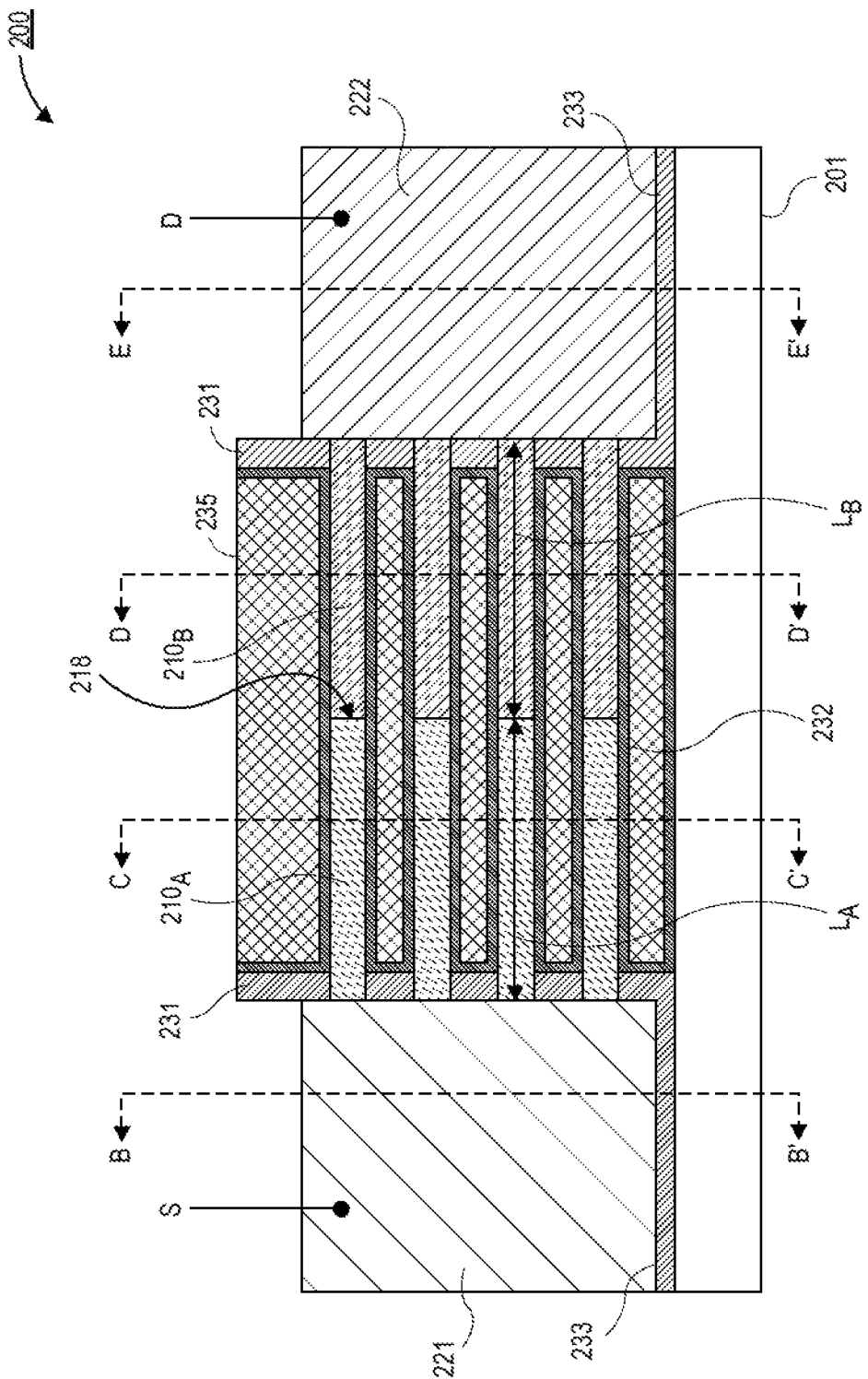
FIG. 2A is a cross-sectional illustration of an ESD diode in a nanoribbon-based architecture, in accordance with an embodiment.

Referring now to FIG. 2A, a cross-sectional illustration of an ESD diode 200 is shown, in accordance with an embodiment. In an embodiment, the ESD diode 200 may be disposed over a substrate 201. The underlying semiconductor substrate 201 represents a general workpiece object used to manufacture integrated circuits. The semiconductor substrate 201 often includes a wafer or other piece of silicon or another semiconductor material. Suitable semiconductor substrates 201 include, but are not limited to, single crystal silicon, polycrystalline silicon and silicon on insulator (SOI), as well as similar substrates formed of other semiconductor materials, such as substrates including germanium, carbon, or group III-V materials. As shown in the cross-sectional illustrations in FIGS. 2B-2E, the underlying semiconductor substrate 201 may be fin shaped. The illustrated portion of the semiconductor substrate 201 may extend down and merge with a larger portion of the semiconductor substrate 201 (e.g., a wafer or the like).

In an embodiment, the ESD diode 200 may comprise a source 221 and a drain 222. The source 221 may be a first conductivity type and the drain 222 may be a second conductivity type that is opposite from the first conductivity type. For example, the source 221 may be N-type and the drain 222 may be P-type. In an embodiment, the source/drain regions 221/222 may comprise an epitaxially grown semiconductor material. The source/drain regions 221/222 may comprise a silicon alloy. In some implementations, the source/drain regions 221/222 comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions 221/222 may comprise alternative semiconductor materials (e.g., semiconductors comprising group III-V elements and alloys thereof) or conductive materials.

In an embodiment, one or more semiconductor bodies 210 may extend between the source 221 and the drain 222. For example, a vertical stack of semiconductor bodies 210 may extend between the source 221 and the drain 222. The semiconductor bodies 210 may be nanoribbons or nanowires. As used herein, the semiconductor bodies 210 will be referred to as nanoribbons 210 for simplicity. In an embodiment, the nanoribbons 210 may be any suitable semiconductor material, such as, but not limited to, silicon, germanium, SiGe, GaAs, InSb, GaP, GaSb, InAlAs, InGaAs, GaSbP, GaAsSb, and InP.

In an embodiment, the nanoribbons 210 may each comprise a first region $210_A$ and a second region $210_B$. The first regions $210_A$ are adjacent to the source 221, and the second regions $210_B$ are adjacent to the drain 222. The first regions $210_A$ may directly contact the second regions $210_B$ at an interface 218. In an embodiment, the interface 218 is substantially equidistant to the source 221 and the drain 222. For example, the first region $210_A$ may have a first length $L_A$ and the second region $210_B$ may have a second length $L_B$ that is substantially equal to the first length $L_A$. In other embodiments (as described in greater detail below) the first length $L_A$ may be different than the second length $L_B$. In an embodiment, the combined length of the first length $L_A$ and the second length $L_B$ may be approximately 50 nm or greater, approximately 100 nm or greater, or approximately 150 nm or greater.

In an embodiment, the first regions $210_A$ may be doped to have the same conductivity type as the source 221 and the second regions $210_B$ may be doped to have the same conductivity type as the drain 222. For example, the first regions $210_A$ may be the first conductivity type (e.g., N-type), and the second regions $210_B$ may be the second conductivity type (e.g., P-type). A dopant concentration of the first regions $210_A$ may be lower than a dopant concentration of the source 221, and a dopant concentration of the second regions $210_B$ may be lower than a dopant concentration of the drain 222. For example, the source 221 and the drain 222 may have a dopant concentration of approximately $10^{19}$ cm$^{-3}$ or greater, or approximately $10^{20}$ cm$^{-3}$ or greater, and the first regions $210_A$ and the second regions $210_B$ may have a dopant concentration of approximately $10^{19}$ cm$^{-3}$ or less, or between approximately $10^{17}$ cm$^{-3}$ and $10^{19}$ cm$^{-3}$. In an embodiment, a dopant concentration of the first region $210_A$ may be substantially similar to a dopant concentration of the second region $210_B$. In other embodiments, the dopant concentration of the first region $210_A$ may be different than the dopant concentration of the second region $210_B$.

In an embodiment, the nanoribbons 210 may be covered by a dummy gate structure. The dummy gate structure may comprise a pair of spacers 231, a gate dielectric 232, and a dummy gate electrode 235. The gate structure is referred to as a "dummy" gate structure since the dummy gate electrode 235 is not electrically connected to circuitry outside of the ESD diode 200. That is, the dummy gate electrode 235 may be referred to as a "floating" electrode since it is not held to a particular voltage. A dummy gate structure is provided for several reasons. One reason is that the presence of a dummy gate structure allows for a consistent process flow with other devices (e.g., nanoribbon transistors) formed on the substrate 201. Additionally, the presence of the spacers 231 for the dummy gate structure provides a confined opening into which the source 221 and drain 222 may be epitaxially grown. Without the spacers 231, the source 221 and drain 222 would extend laterally over portions of the first regions $210_A$ and the second regions $210_B$, respectively.

In an embodiment, a first of the spacers 231 may be adjacent to the source 221 and a second of the spacers 231 may be adjacent to the drain 222. In an embodiment, the first regions $210_A$ may pass through the first spacer 231 to contact the source 221 and the second regions $210_B$ may pass through the second spacer 231 to contact the drain 222.

Figure 2B:
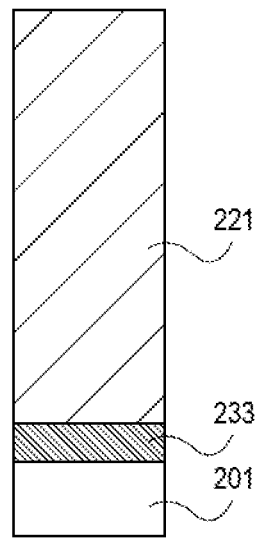
FIG. 2B is a cross-sectional illustration of the ESD diode in FIG. 2A along line B-B', in accordance with an embodiment.
Figure 2C:
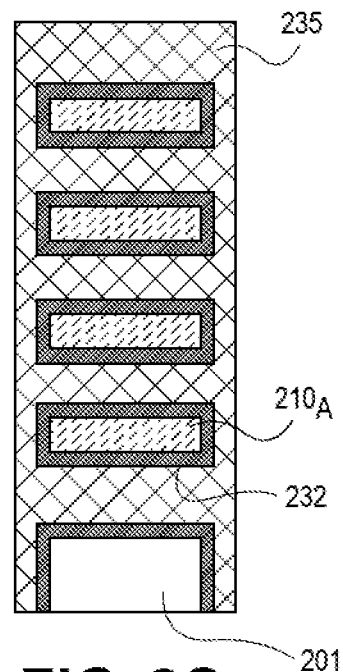
FIG. 2C is a cross-sectional illustration of the ESD diode in FIG. 2A along line C-C', in accordance with an embodiment.

In an embodiment, a gate dielectric 232 is disposed around each of the nanoribbons 210. As shown in FIG. 2C (which is a cross-sectional illustration along line C-C' in FIG. 2A) and FIG. 2D (which is a cross-sectional illustration along line D-D' in FIG. 2A), the gate dielectric 232 wraps around an entire perimeter of the first regions $210_A$ and the second regions $210_B$ of the nanoribbons 210. In an embodiment, the gate dielectric 232 may also be disposed over interior surfaces of the spacers 231 and over a portion of the substrate 201. Such a configuration may be provided when the gate dielectric 232 is deposited with an atomic layer deposition (ALD) process. In other embodiments, an oxidation process may be used to form the gate dielectric 232. In such embodiments, the gate dielectric 232 may be absent from along the interior sidewalls of the spacers 231.

In an embodiment, the materials chosen for the gate dielectric 232 may be any suitable high dielectric constant materials. For example, the gate dielectric 232 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 2D:
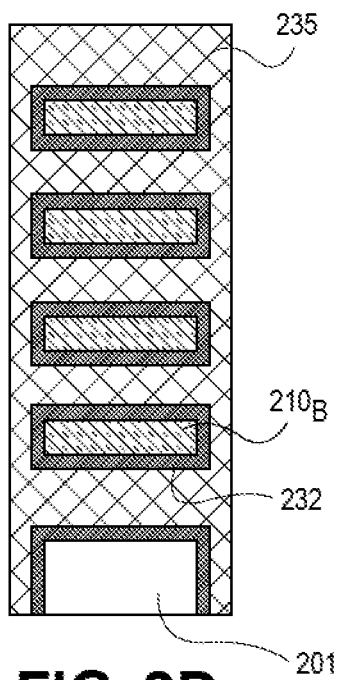
FIG. 2D is a cross-sectional illustration of the ESD diode in FIG. 2A along line D-D', in accordance with an embodiment.
Figure 2E:
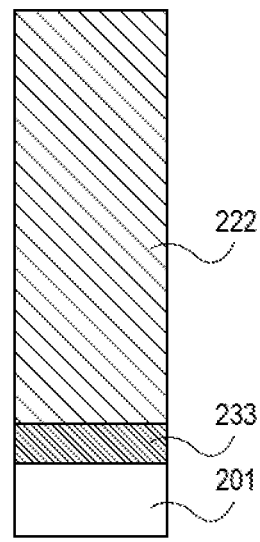
FIG. 2E is a cross-sectional illustration of the ESD diode in FIG. 2A along line E-E', in accordance with an embodiment.

In an embodiment, the dummy gate electrode 235 may surround the gate dielectric 232. As shown in FIGS. 2C and 2D, the dummy gate electrode 235 may surround the entire perimeter of the first regions $210_A$ and the second regions $210_B$ of the nanoribbons 210. As noted above, the dummy gate electrode 235 is not directly connected to circuitry outside of the ESD diode 200 and is a floating conductive body. In an embodiment, the dummy gate electrode 235 may be any suitable conductive material. In an embodiment, the dummy gate electrode 235 may be the same material as used for one or more nanoribbon transistors in other locations on the substrate 201. For example, the dummy gate electrode 235 may include, but is not limited to, hafnium, zirconium, titanium, tantalum, aluminum, and metal carbides that include these elements, (e.g., titanium carbide, zirconium carbide, tantalum carbide, hafnium carbide, and aluminum carbide), ruthenium, palladium, platinum, cobalt, nickel, and conductive metal oxides, (e.g., ruthenium oxide). The dummy gate electrode 235 may also comprise a workfunction metal and a fill metal (e.g., tungsten) over the workfunction metal.

In an embodiment, the source 221 and the drain 222 are electrically isolated from the substrate 201. As shown in FIG. 2B (which is a cross-section along line B-B' in FIG. 2A) and FIG. 2E (which is a cross-section along line E-E' in FIG. 2A), an insulating layer 233 may separate the substrate 201 from the bottom surfaces of the source 221 and drain 222. In some embodiments, the insulating layer 233 may be the same material as the spacers 231. For example, the insulating layer 233 (or portions of the insulating layer 233) may be residual material left over during a spacer etching process used to form the spacers 231. In other embodiments, the insulating layer 233 may be a different material than the spacers 231. The insulating layer 233 may also be disposed or otherwise formed with processing operations distinct from the spacer etching process used to form the spacers 231.

Figure 2F:
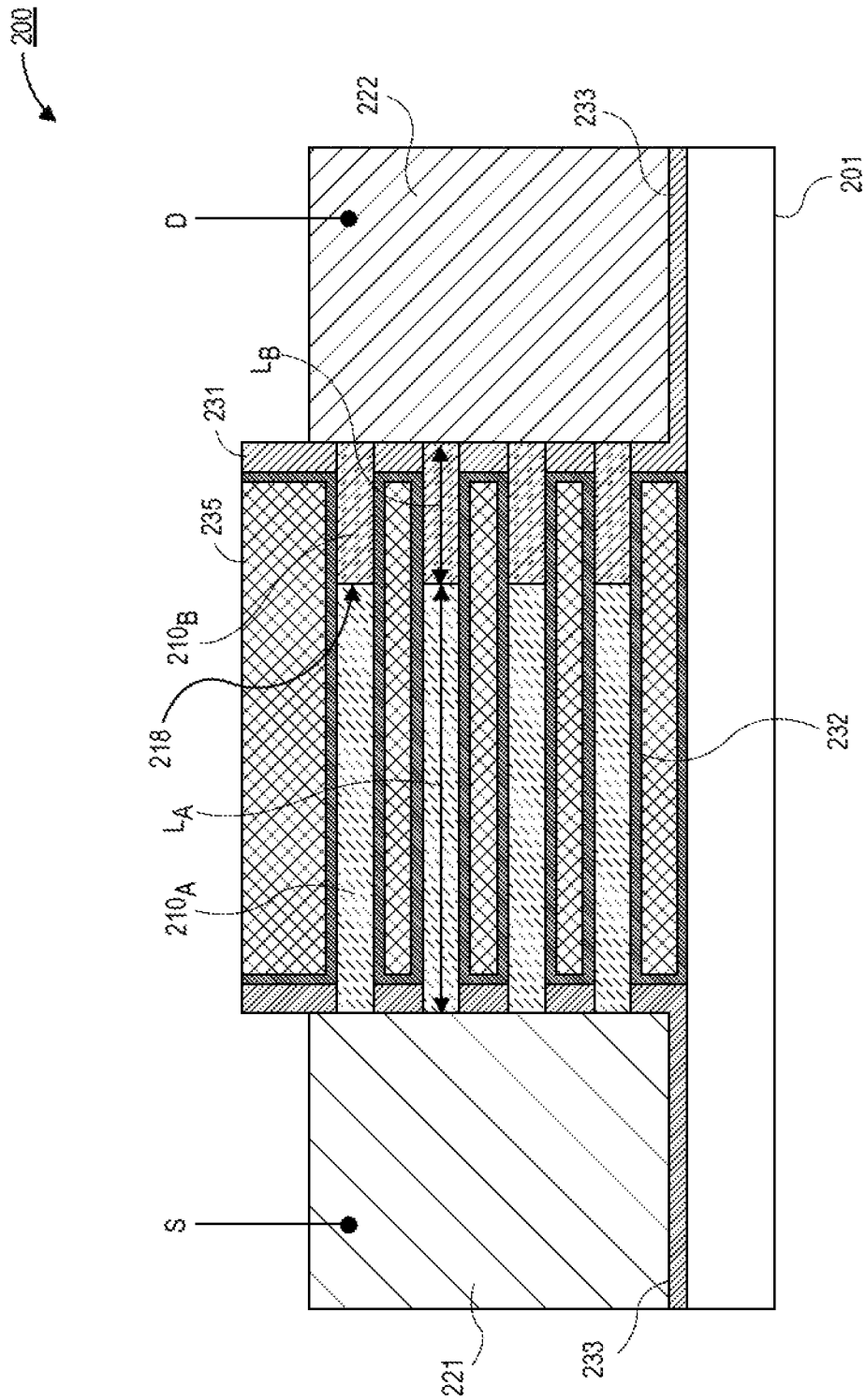
FIG. 2F is a cross-sectional illustration of an ESD diode with a first region of the nanoribbons that is longer than a second region of the nanoribbons, in accordance with an embodiment.

Referring now to FIG. 2F, a cross-sectional illustration of an ESD diode 200 is shown, in accordance with an embodiment. In an embodiment, the ESD diode 200 in FIG. 2F may be substantially similar to the ESD diode 200 in FIG. 2A, with the exception that the interface 218 between the first regions $210_A$ and the second regions $210_B$ may be shifted. For example, the interface 218 in FIG. 2F is shifted towards the drain 222. As such, a first length $L_A$ of the first regions $210_A$ is greater than a second length $L_B$ of the second regions $210_B$. In other embodiments, the interface 218 between the first regions $210_A$ and the second regions $210_B$ may be shifted towards the source 221.

Figure 3A:
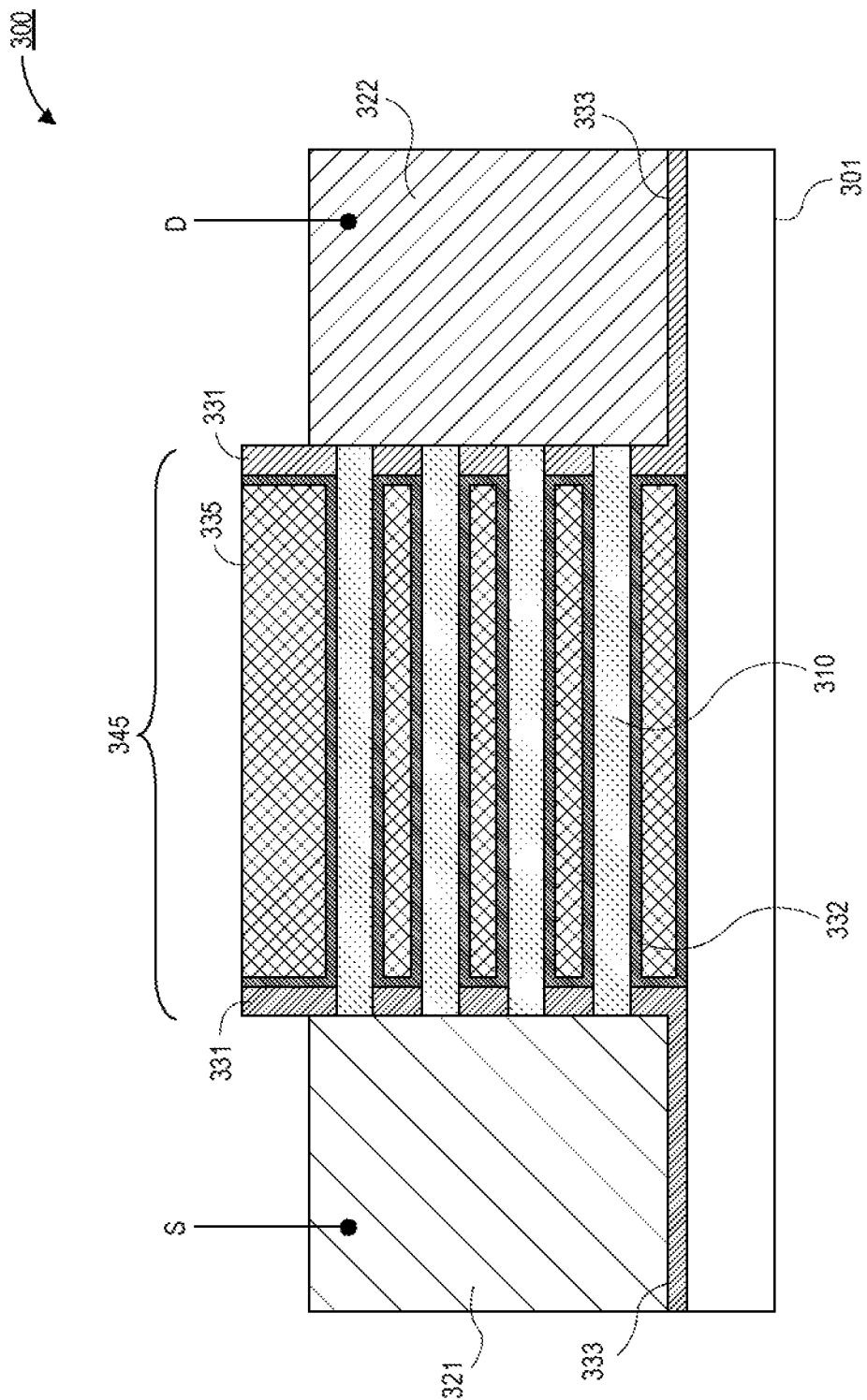
FIG. 3A is a cross-sectional illustration of an ESD diode with intrinsic semiconductor nanoribbons where the depletion region is along substantially the entire length of the nanoribbons, in accordance with an embodiment.

Referring now to FIG. 3A, a cross-sectional illustration of an ESD diode 300 is shown, in accordance with an embodiment. The ESD diode 300 may be referred to as a P-I-N diode. That is, the ESD diode 300 comprises an N-doped region (e.g., the source 321), an intrinsic semiconductor region (e.g., nanoribbons 310), and a P-doped region (e.g., the drain 322).

In an embodiment, the ESD diode 300 may be disposed over a substrate 301. The substrate 301 may be similar to the substrate 201 described above. In an embodiment, one or more nanoribbons 310 may connect a source 321 to a drain 322. In an embodiment, the source 321 may be a first conductivity type and the drain 322 may be a second conductivity type that is opposite from the first conductivity type. For example, the source 321 may be N-type and the drain may be P-type. In an embodiment, the nanoribbons 310 may be intrinsic semiconductors. That is, the nanoribbons 310 may be substantially undoped. For example, the nanoribbons 310 may be undoped silicon or any other undoped semiconductor material.

In an embodiment, the ESD diode 300 may comprise a dummy gate structure. The dummy gate structure may be substantially similar to the dummy gate structure in ESD diode 200. For example, the dummy gate structure may comprise a pair of spacers 331, a gate dielectric 332 and a dummy gate electrode 335. Similar to the dummy gate electrode 235, the dummy gate electrode 335 may be a floating electrode. That is, the dummy gate electrode 335 may not be connected to circuitry outside of the ESD diode 300.

In an embodiment, the source 321 and the drain 322 may be separated from the substrate 301 by an insulating layer 333. For example, the insulating layer 333 may be the same material as the spacers 331. In some embodiments, at least part of the insulating layer 333 is formed during the spacer etching process used to form the spacers 331. In other embodiments, at least a portion of the insulating layer 333 is formed with processes other than the spacer etching process used to form the spacers 331.

In an embodiment, the use of a P-I-N ESD diode 300 provides a large depletion region 345. For example, when the ESD diode 300 is at equilibrium (i.e., with zero voltage applied across the source 321 and the drain 322), the depletion region 345 may extend substantially along an entire length of the nanoribbons. A larger depletion region 345 provides higher capacitance to the ESD diode 300 and a reduced leakage. However, if a lower capacitance (and a corresponding higher leakage) is desired, then a length of the depletion region 345 may be reduced by modulating the charge carriers in the nanoribbons 310. The charge carriers may be modulated (i.e., by making the charge carriers more P-type or N-type) by choosing different work function materials for the dummy gate electrode 335 and/or by choosing different materials for the gate dielectric 332.

Figure 3B:
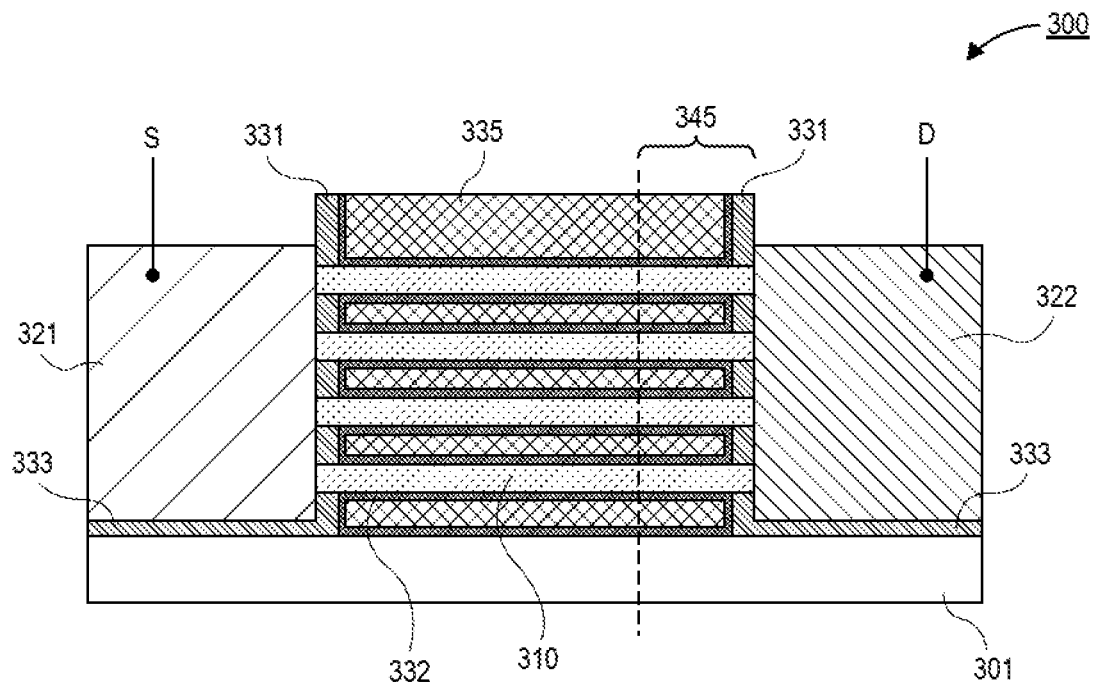
FIG. 3B is a cross-sectional illustration of an ESD diode with intrinsic semiconductor nanoribbons where the depletion region is shifted towards the drain, in accordance with an embodiment.
Figure 3C:
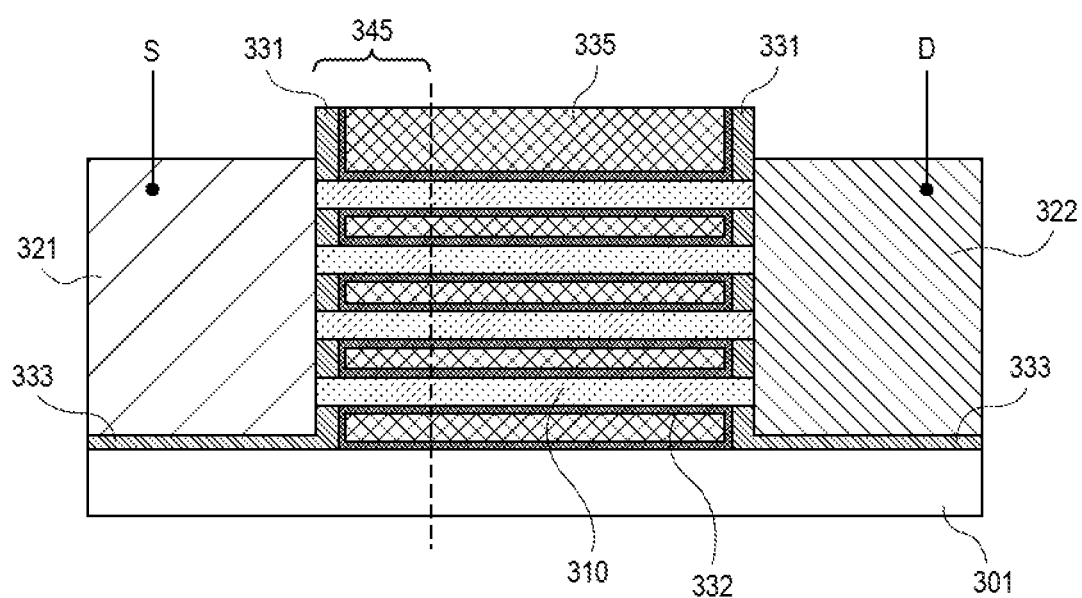
FIG. 3C is a cross-sectional illustration of an ESD diode with intrinsic semiconductor nanoribbons where the depletion region is shifted towards the source, in accordance with an embodiment.

Examples of modulation of the charge carriers and shifting of the depletion region 345 is shown in FIGS. 3B and 3C. As shown in FIG. 3B, the depletion region 345 is reduced in length and shifted towards the drain 322. Such a shift may be induced by using an N-type work function material for the dummy gate electrode 335. N-type workfunction metal for the dummy gate electrode 335 preferably has a workfunction that is between about 3.9 eV and about 4.2 eV. Alternatively, as shown in FIG. 3C, the depletion region 345 is reduced in length and shifted towards the source 321. Such a shift may be induced by using a P-type work function material for the dummy gate electrode 335. P-type workfunction metal for the dummy gate electrode 335 preferably has a workfunction that is between about 4.9 eV and about 5.2 eV.

Referring now to FIGS. 4A-4M, a series of cross-sectional illustrations depicting a process for forming an ESD diode 400 is shown, in accordance with an embodiment. The ESD diode 400 formed in FIGS. 4A-4M may be a P-N diode.

Figure 4A:
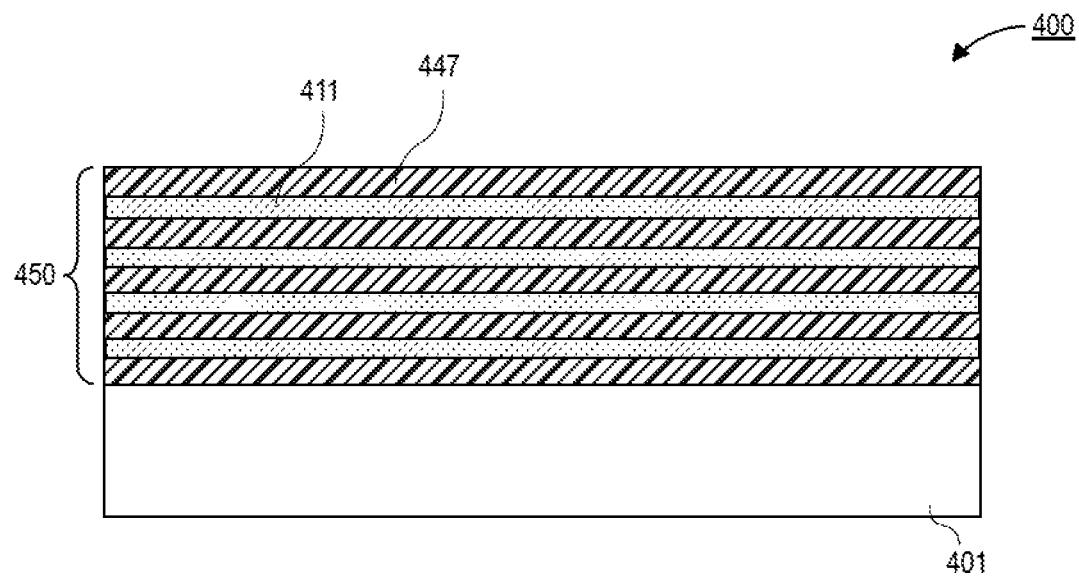
FIGS. 4A-4M are cross-sectional illustrations depicting a process for forming an ESD diode with a nanoribbon architecture, in accordance with an embodiment.

Referring now to FIG. 4A, a cross-sectional illustration of an ESD diode 400 at an early stage of manufacture is shown, in accordance with an embodiment. In an embodiment, the ESD diode 400 may comprise a semiconductor substrate 401 and a stack 450 over the semiconductor substrate 401. The stack 450 may comprise alternating layers of device layers 411 and sacrificial layers 447. In an embodiment, the device layers 411 and the sacrificial layers 447 are materials that can be etched selectively with respect to each other. For example, the sacrificial layers 447 may be removed with an etching process that leaves the device layers 411 substantially unaltered.

In an embodiment, the device layers 411 and sacrificial layers 447 may each be a material such as, but not limited to, silicon, germanium, SiGe, GaAs, InSb, GaP, GaSb, InAlAs, InGaAs, GaSbP, GaAsSb, and InP. In a specific embodiment, the device layers 411 are silicon and the sacrificial layers 447 are SiGe. In another specific embodiment, the device layers 411 are germanium, and the sacrificial layers 447 are SiGe. The device layers 411 and the sacrificial layers 447 may be grown with an epitaxial growth processes.

In the illustrated embodiment there are four device layers 411. However, it is to be appreciated that there may be any number of device layers 411 in the stack 450. In an embodiment, the topmost layer of the stack 450 is a sacrificial layer 447. In other embodiments, the topmost layer of the stack 450 may be device layer 411.

Figure 4B:
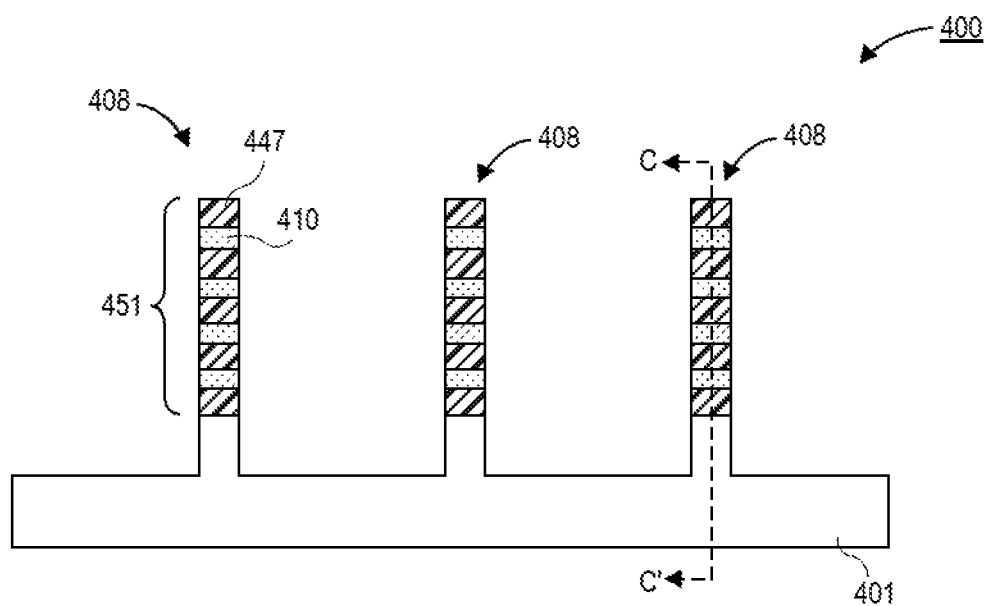

Referring now to FIG. 4B, a cross-sectional illustration of the ESD diode 400 after fins 408 are patterned into the stack 450 and into the substrate 401 is shown, in accordance with an embodiment. In an embodiment, the patterned stack layer 450 may be referred to a patterned stack 451. The patterned stack 451 may comprise alternating sacrificial layers 447 and semiconductor bodies 410. Depending on the dimensions of the fins 408, the semiconductor bodies 410 may be nanowires or nanoribbons. For simplicity, the semiconductor bodies 410 will be referred to herein as nanoribbons 410.

Figure 4C:
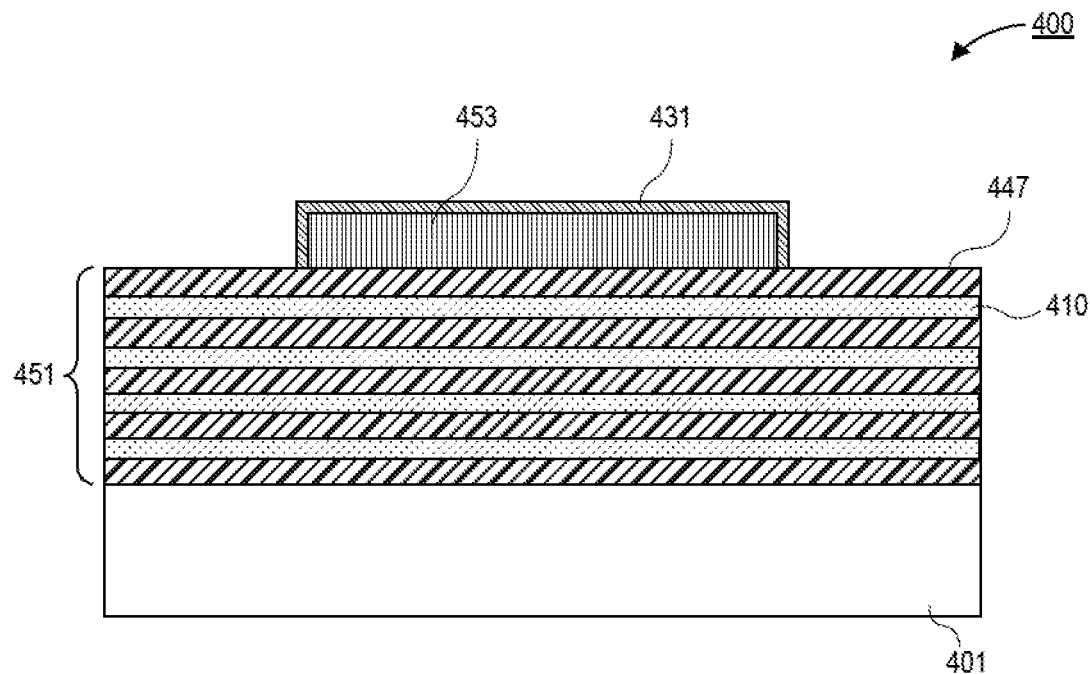

Referring now to FIG. 4C, a cross-sectional illustration of the ESD diode 400 along the line C-C' in FIG. 4B is shown, in accordance with an embodiment. In an embodiment, a sacrificial gate 453 is disposed over the patterned stack 451. It is to be appreciated that the sacrificial gate 453 also extends along the sidewalls of the patterned stack 451 (i.e., into and out of the plane illustrated in FIG. 4C). In an embodiment, a spacer material 431 is disposed over the sacrificial gate 453.

Figure 4D:
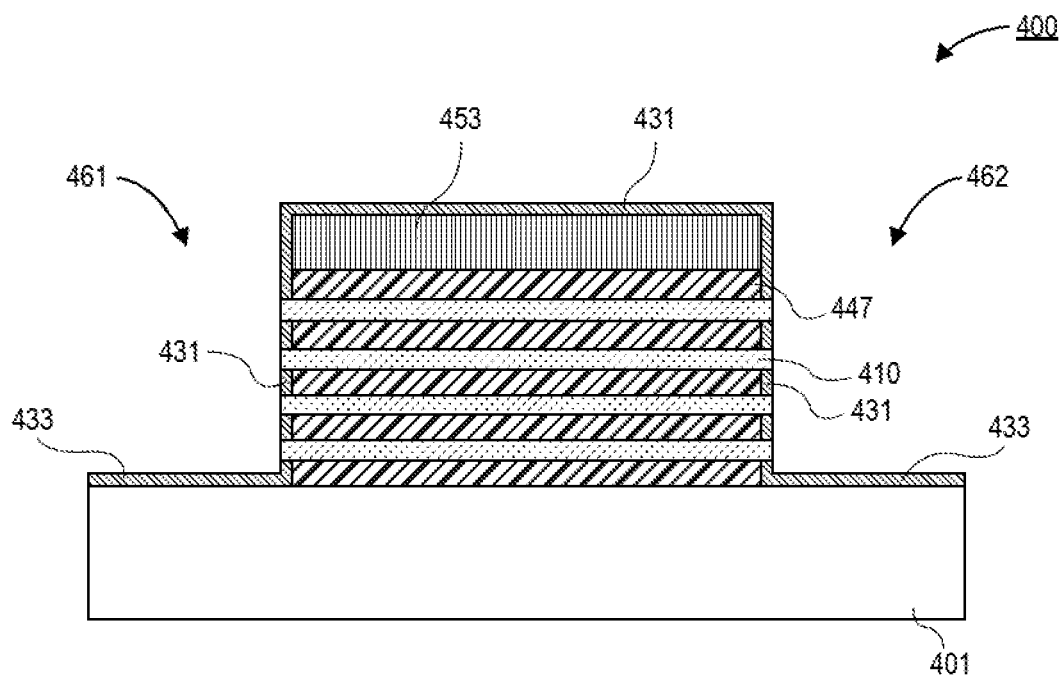

Referring now to FIG. 4D, a cross-sectional illustration of the ESD diode 400 after a source opening 461 and a drain opening 462 are formed is shown, in accordance with an embodiment. In an embodiment, the source opening 461 and the drain opening 462 may be disposed into the patterned stack 451 on opposite ends of the sacrificial gate 453. In an embodiment, spacers 431 may also extend down along the sides of the source opening 461 and the drain opening 462 adjacent to the sacrificial gate 453. The spacers 431 may fill dimples (i.e., lateral recesses) into the sacrificial layers 447. That is, the nanoribbons 410 may pass through the spacers 431, and the sacrificial layers 447 end at the interior surface of the spacers 431.

In an embodiment, the etching process (or processes) to form the vertical spacers along the sidewalls of the sacrificial gate 453 may also result in the formation of an insulating layer 433 over the top surface of the semiconductor substrate 401. In some embodiments, the insulating layer 433 and the spacers 431 may be the same material. In other embodiments, the insulating layer 433 over the substrate 401 may be formed with one or more different processing operations known to those skilled in the art.

Figure 4E:
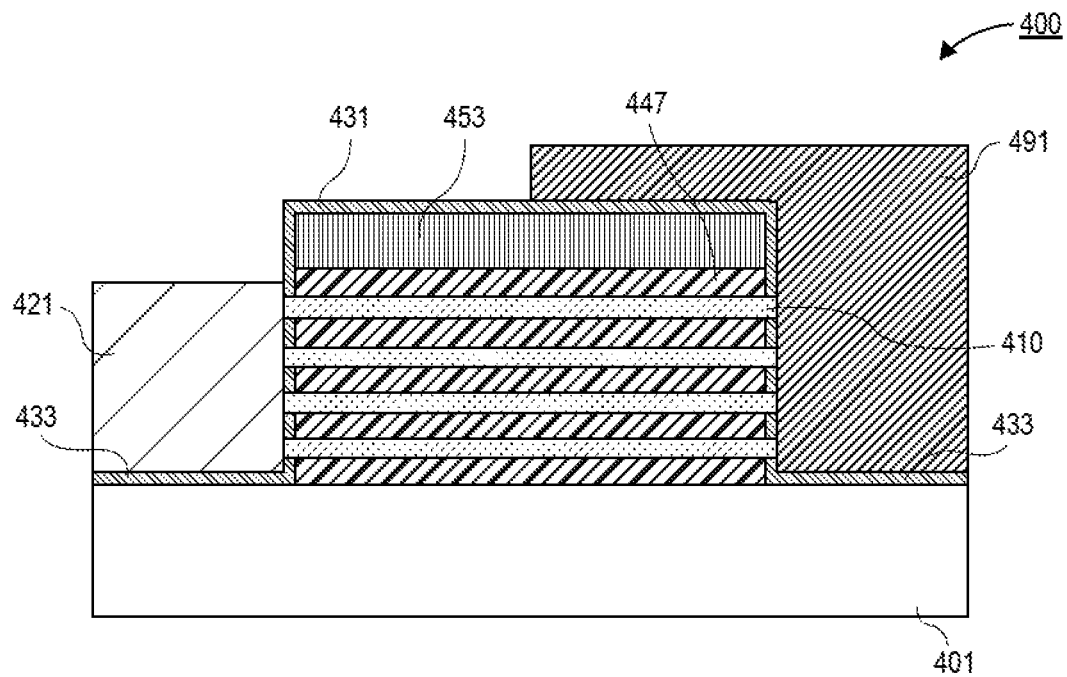

Referring now to FIG. 4E, a cross-sectional illustration of the ESD diode 400 after a source 421 is disposed in the source opening 461 is shown, in accordance with an embodiment. The source 421 may be in direct contact with ends of the nanoribbons 410. In an embodiment, the source 421 may be grown with an epitaxial growth process. Materials and epitaxial growth processes for the source 421 are described in greater detail above. The epitaxial growth of the source 421 is a confined growth. That is, the source 421 is confined by the spacer 431 adjacent to the sacrificial gate 453. An additional spacer (not show) or other structure may be located along the left edge of the source 421 to confine the epitaxial growth. In an embodiment, the epitaxial growth into and out of the plane of FIG. 4E may be confined by an insulator, such as an oxide that is disposed around the fin 408 before forming the source opening 461 and the drain opening 462.

In an embodiment, the source 421 may have a first conductivity type. The source 421 may be in-situ doped during the epitaxial growth. In some embodiments, the first conductivity type is N-type. In an embodiment, a dopant concentration of the source 421 may be approximately $10^{19}$ $cm^{-3}$ or greater, or approximately $10^{20}$ $cm^{-3}$ or greater. In an embodiment, the epitaxial growth of the source 421 is implemented with a first mask 491. The first mask 491 may cover the drain opening 462. This prevents the formation of material with the first conductivity type in the drain opening 462.

Figure 4F:
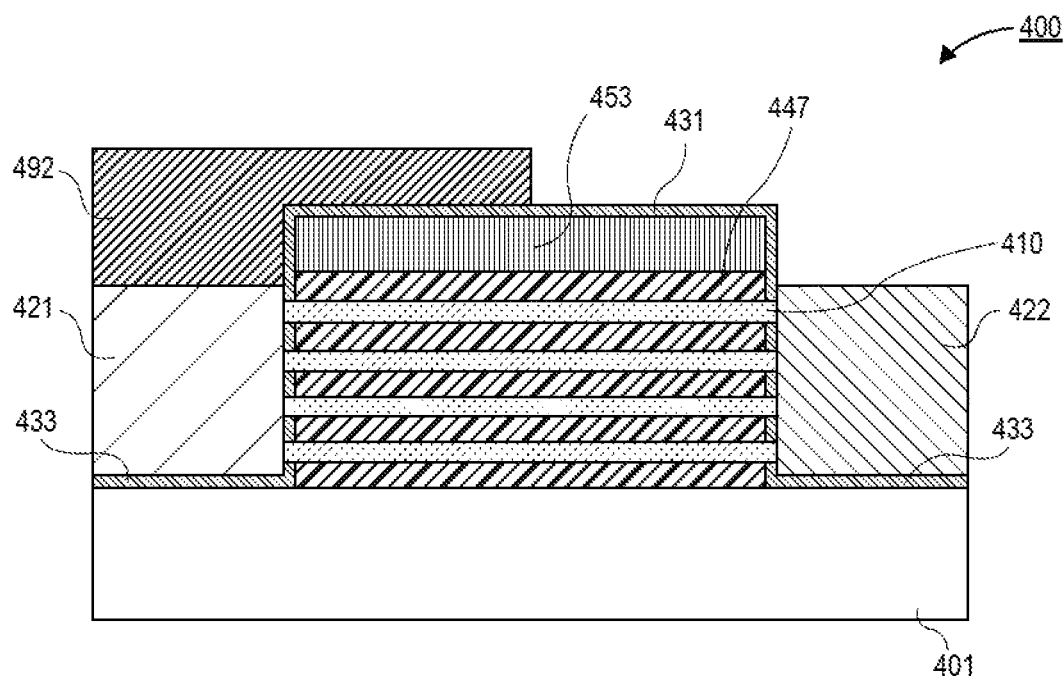

Referring now to FIG. 4F, a cross-sectional illustration of the ESD diode 400 after a drain 422 is disposed in the drain opening 462 is shown, in accordance with an embodiment. In an embodiment, the drain 422 is disposed after removing the first mask 491. A second mask 492 is then disposed over the source 421. This prevents the formation of material with the second conductivity type over the source 421.

In an embodiment, the drain 422 may be in direct contact with ends of the nanoribbons 410. In an embodiment, the drain 422 may be grown with an epitaxial growth process. Materials and epitaxial growth processes for the drain 422 are described in greater detail above. The epitaxial growth of the drain 422 is a confined growth. That is, the drain 422 is confined by the spacer 431 adjacent to the sacrificial gate 453. An additional spacer (not show) or other structure may be located along the right edge of the drain 422 to confine the epitaxial growth. In an embodiment, the epitaxial growth into and out of the plane of FIG. 4E may be confined by an insulator, such as an oxide that is disposed around the fin 408 before forming the source opening 461 and the drain opening 462.

In an embodiment, the drain 422 may have a second conductivity type that is opposite from the first conductivity type. The drain 422 may be in-situ doped during the epitaxial growth. In some embodiments, the second conductivity type is P-type. In an embodiment, a dopant concentration of the drain 422 may be approximately $10^{19}$ cm$^{-3}$ or greater, or approximately $10^{20}$ cm$^{-3}$ or greater. In an embodiment, the epitaxial growth of the drain 422 is implemented with a second mask 492.

Figure 4G:
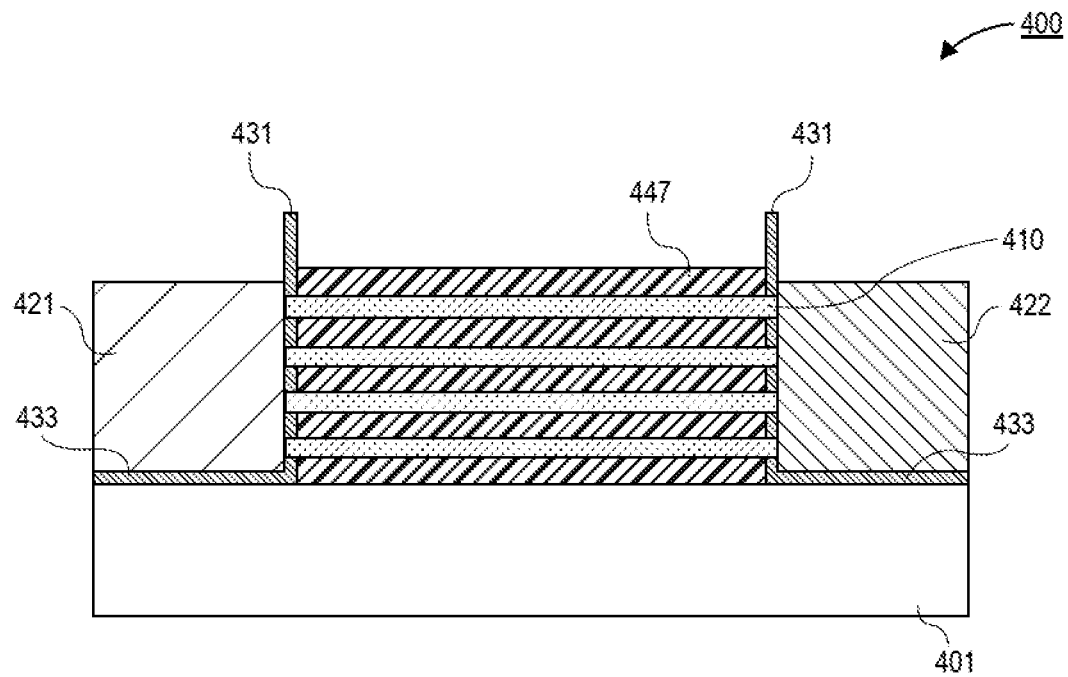

Referring now to FIG. 4G, a cross-sectional illustration after the second mask 492 is removed and the sacrificial gate 453 is removed is shown, in accordance with an embodiment. Removal of the sacrificial gate 453 exposes the nanoribbons 410 and the sacrificial layers 447. The sacrificial gate 453 may be removed with any suitable etching process.

Figure 4H:
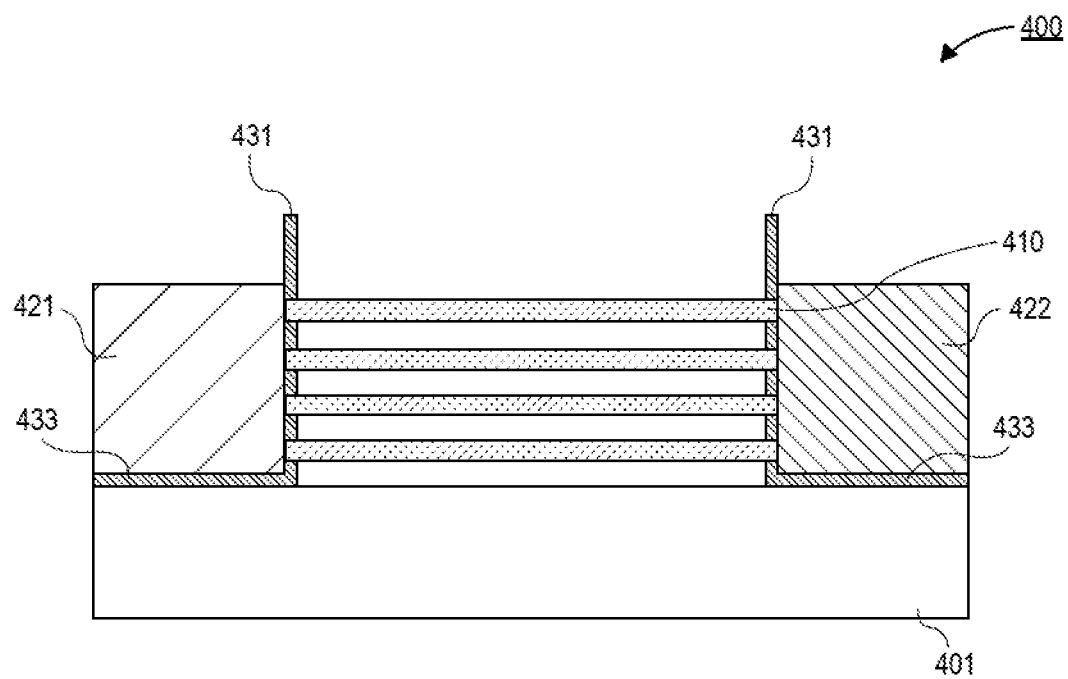

Referring now to FIG. 4H, a cross-sectional illustration after the sacrificial layers 447 are removed is shown, in accordance with an embodiment. In an embodiment, the sacrificial layers 447 are removed with an etching process that is selective to the nanoribbons 410. Sacrificial layers 447 may be removed using any known etchant that is selective to nanoribbons 410. In an embodiment, the selectivity is greater than 100:1. In an embodiment where nanoribbons 410 are silicon and sacrificial layers 447 are silicon germanium, sacrificial layers 447 are selectively removed using a wet etchant such as, but not limited to, aqueous carboxylic acid/nitric acid/HF solution and aqueous citric acid/nitric acid/HF solution. In an embodiment where nanoribbon 410 are germanium and sacrificial layers 447 are silicon germanium, sacrificial layers 447 are selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. In another embodiment, sacrificial layers 447 are removed by a combination of wet and dry etch processes.

Figure 4I:
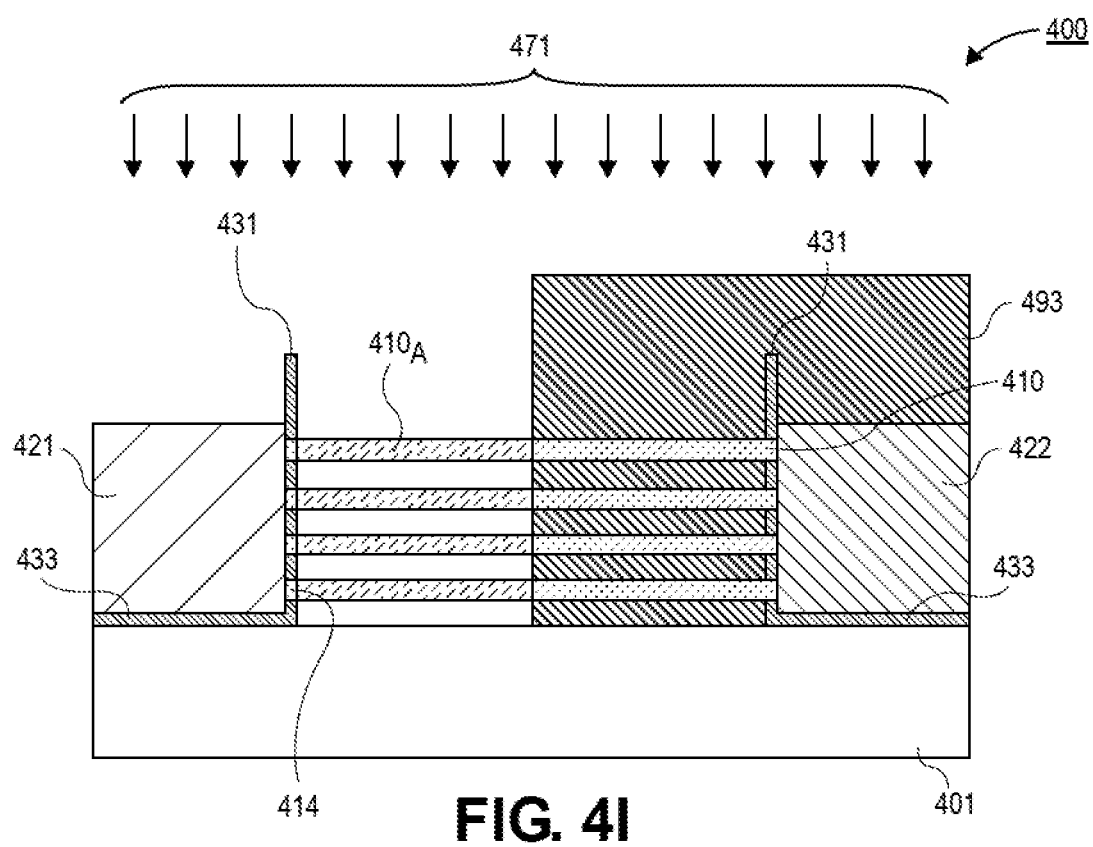

Referring now to FIG. 4I, a cross-sectional illustration after the first regions 410$_A$ are formed is shown, in accordance with an embodiment. In an embodiment, the first regions 410$_A$ are exposed by an opening in a third mask 493. The third mask 493 covers a portion of the nanoribbons 410 and the drain 422. In an embodiment, dopants 471 are provided to the first regions 410$_A$. For example, the first regions 410$_A$ may be doped with an ion implantation process, or the like. The first regions 410$_A$ may be doped to have the first conductivity type. For example, when the source 421 is N-type, the first regions 410$_A$ are also N-type. In an embodiment, the first regions 410$_A$ may have a dopant concentration that is less than a dopant concentration of the source 421. For example, the dopant concentration of the first region 410$_A$ may be approximately $10^{19}$ cm$^{-3}$ or less, or between approximately $10^{17}$ cm$^{-3}$ and $10^{19}$ cm$^{-3}$.

In an embodiment, the doping process may result in the formation of low doped regions 414 along the length of the first regions 410$_A$. The low doped regions 414 may be portions of the first regions 410$_A$ that are shielded from the dopants by the spacers 431. The low doped regions 414 may be identified using one or more different analytical techniques. For example, atom probe tomography (APT) may be used to measure the change in dopant concentration along the length of the first regions 410$_A$. Due to diffusion, there may not be a stepwise drop from a first (higher) dopant concentration to a second (lower) dopant concentration. However, along a length of the first regions 410$_A$, there may be a discernable decrease from a first (higher) dopant concentration to a second (lower) dopant concentration. In an embodiment, the distance between the start of the decrease to the end of the first regions 410$_A$ may be approximately equal to the width of the spacer 431.

Figure 4J:
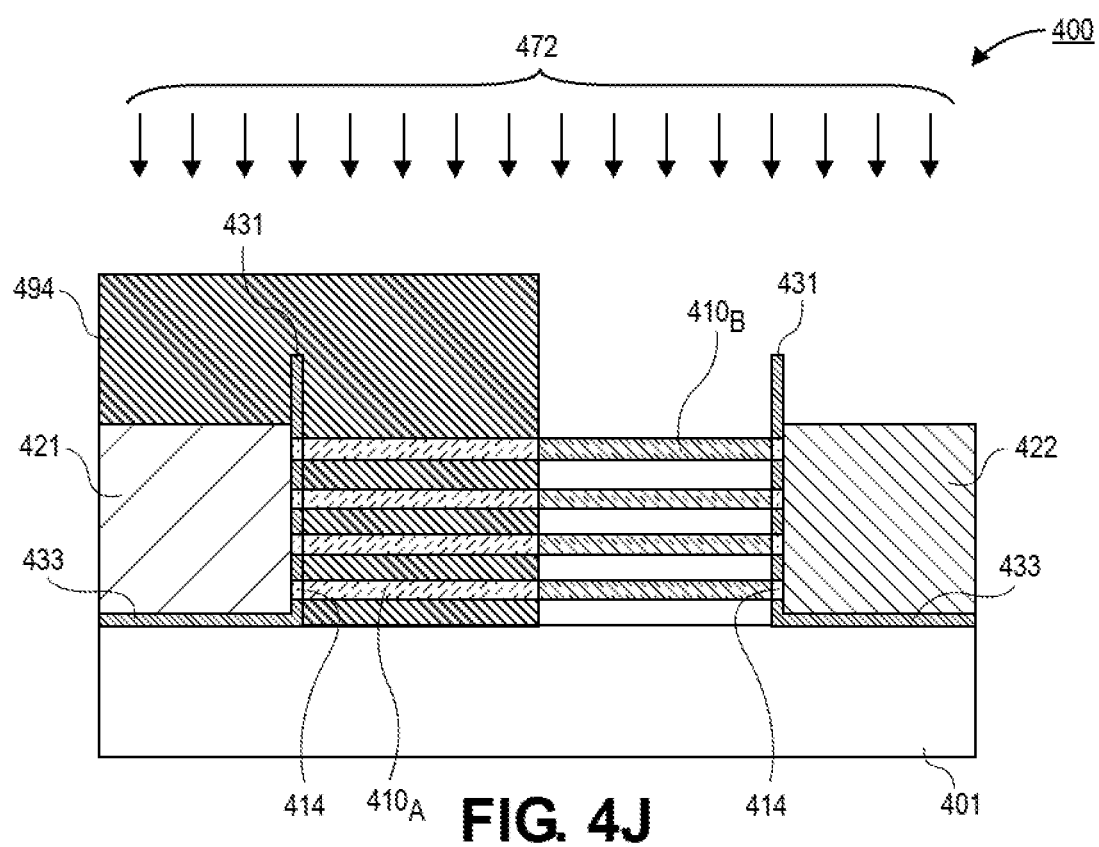

Referring now to FIG. 4J, a cross-sectional illustration of the ESD diode 400 after the third mask 493 is removed and the second regions 410$_B$ are formed is shown, in accordance with an embodiment. In an embodiment, the second regions 410$_B$ are exposed by an opening in a fourth mask 494. The fourth mask 494 covers the first regions 410$_A$ and the source 421. In an embodiment, dopants 472 are provided to the second regions 410$_B$. For example, the second regions 410$_B$ may be doped with an ion implantation process, or the like. The second regions 410$_B$ may be doped to have the second conductivity type. For example, when the drain 422 is P-type, the second regions 410$_B$ are also P-type. In an embodiment, the second regions 410$_B$ may have a dopant concentration that is less than a dopant concentration of the drain 422. For example, the dopant concentration of the second region 410$_B$ may be approximately $10^{19}$ cm" or less, or between approximately $10^{17}$ cm$^{-3}$ and $10^{19}$ cm$^{-3}$.

In an embodiment, the doping process may result in the formation of low doped regions 414 along the length of the second regions 410$_B$. The low doped regions 414 may be portions of the second regions 410$_B$ that are shielded from the dopants by the spacers 431. The low doped regions 414 may be identified using one or more different analytical techniques. For example, APT may be used to measure the change in dopant concentration along the length of the second regions 410$_B$. Due to diffusion, there may not be a stepwise drop from a first (higher) dopant concentration to a second (lower) dopant concentration. However, along a length of the second regions 410$_B$, there may be a discernable decrease from a first (higher) dopant concentration to a second (lower) dopant concentration. In an embodiment, the distance between the start of the decrease to the end of the second regions 410$_B$ may be approximately equal to the width of the spacer 431.

Figure 4K:
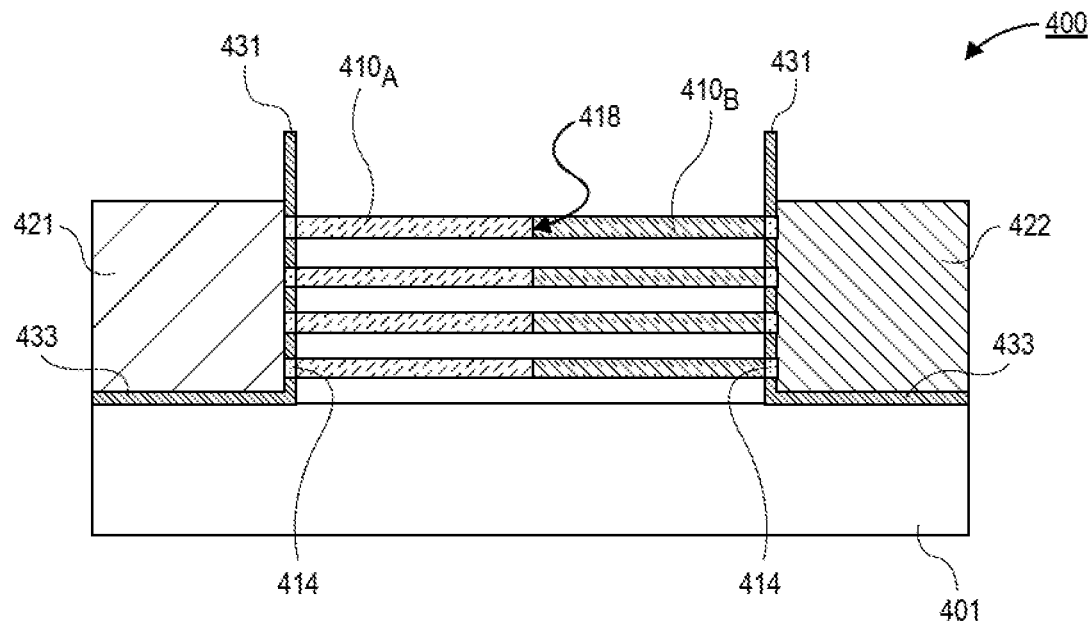

Referring now to FIG. 4K, a cross-sectional illustration of the ESD diode 400 after the fourth mask 494 is removed is shown, in accordance with an embodiment. As illustrated, the ESD diode 400 now has a source 421, first regions 410$_A$ adjacent to the source 421, second regions 410$_B$ adjacent to the first regions 410$_A$, and a drain 422 adjacent to the second regions 410$_B$. Due to the different conductivity types of the first regions 410$_A$ and the second regions 410$_B$, a P-N junction at interface 418 is provided.

Figure 4L:
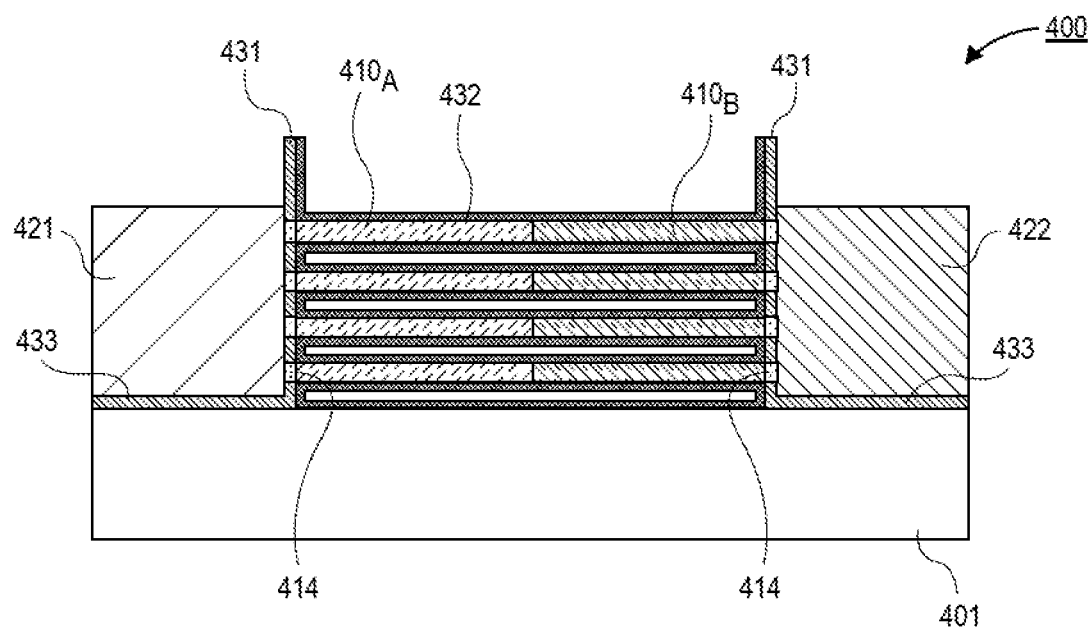

Referring now to FIG. 4L, a cross-sectional illustration of the ESD diode 400 after a gate dielectric 432 is disposed over the first regions 410$_A$ and the second regions 410$_B$ is shown, in accordance with an embodiment. The gate dielectric 432 may be disposed with an ALD process or an oxidation process. A gate dielectric 432 deposited with an ALD process is shown. In an embodiment, the gate dielectric 432 covers the first regions 410$_A$ and the second regions 410$_B$ in addition to being disposed over interior surfaces of the spacers 431.

Figure 4M:
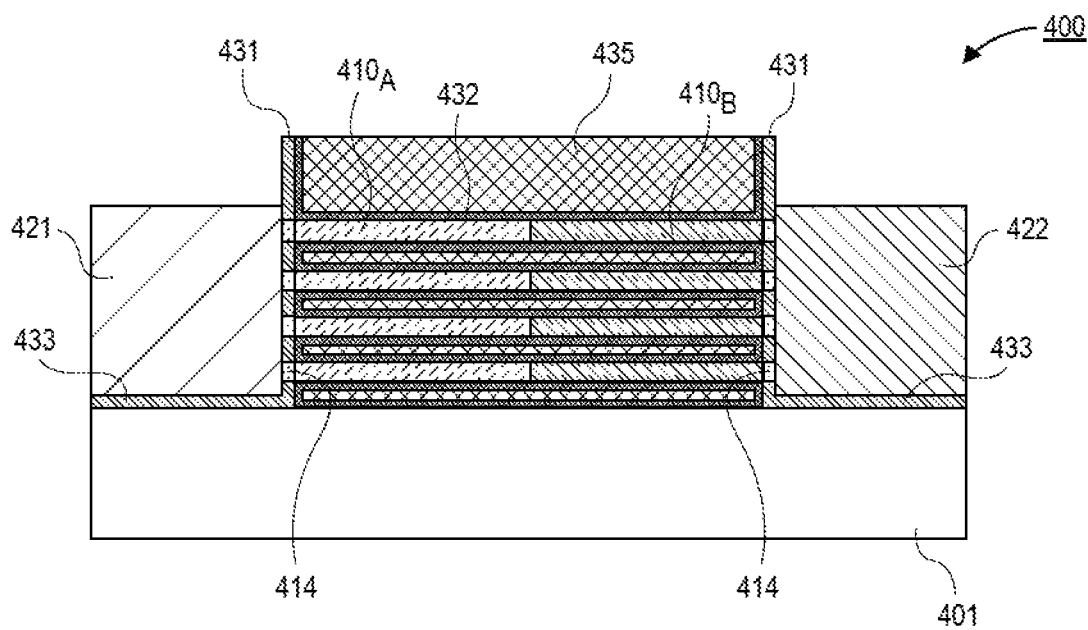

Referring now to FIG. 4M, a cross-sectional illustration of the ESD diode 400 after the dummy gate electrode 435 is disposed over the gate dielectric 432 is shown, in accordance with an embodiment. In an embodiment, the dummy gate electrode 435 may be deposited with any suitable deposition process. In an embodiment, the dummy gate electrode 435 may include a work function metal and a fill metal. The dummy gate electrode 435 is electrically isolated from circuitry external to the ESD diode 400. That is, the dummy gate electrode 435 is a floating electrode.

Referring now to FIGS. 5A-5G, a series of cross-sectional illustrations depicting a process for forming an ESD diode 500 is shown, in accordance with an embodiment. The ESD diode 500 is similar to the ESD diode 400 except that the first regions 510$_A$ and the second regions 510$_B$ are formed earlier in the process flow (i.e., before the formation of the spacers 531) and does not include the low doped regions 414.

Figure 5A:
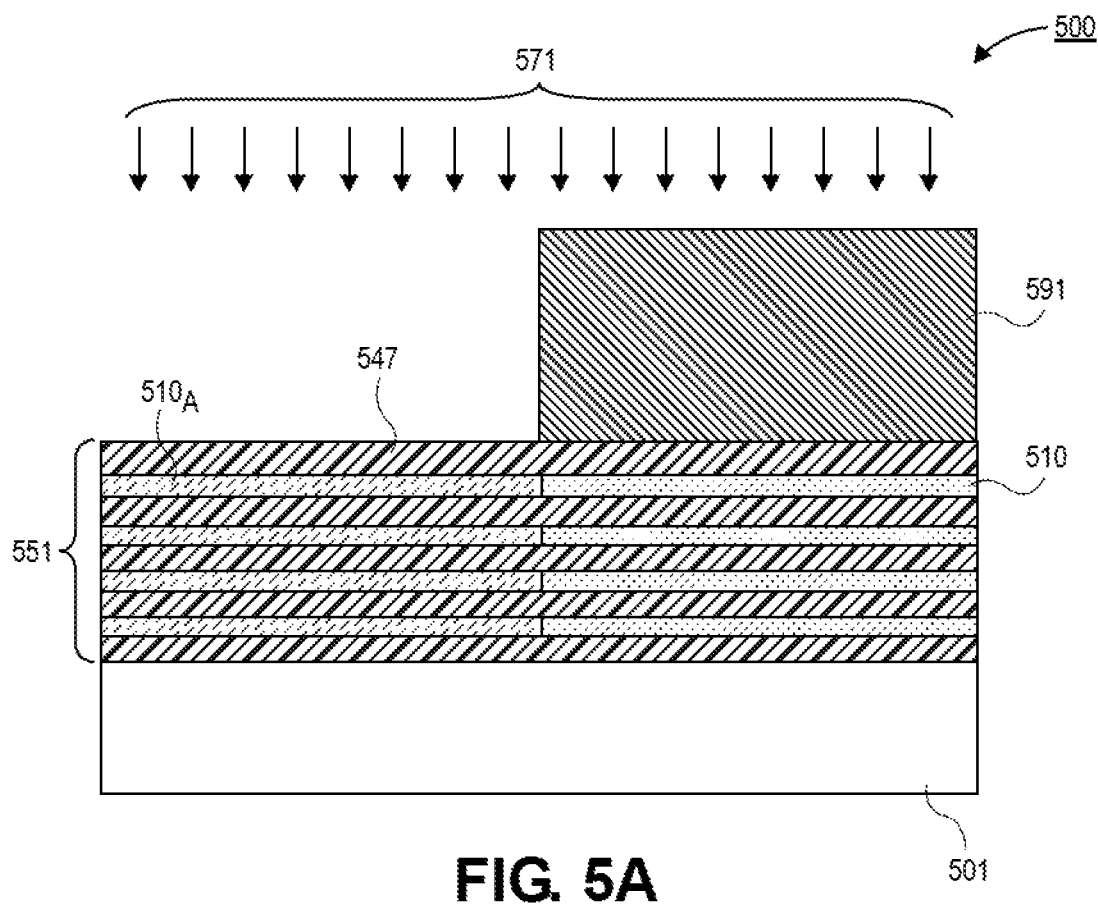
FIGS. 5A-5G are cross-sectional illustrations depicting a process for forming an ESD diode with a nanoribbon architecture, in accordance with an additional embodiment.

Referring now to FIG. 5A, a cross-sectional illustration of an ESD diode 500 at an early stage of manufacture is shown, in accordance with an embodiment. In an embodiment, the ESD diode 500 may comprise a substrate 501 and a patterned stack 551 over the substrate 501. The substrate 501 and the patterned stack 551 may be fabricated with processes substantially similar to those described above with respect to FIGS. 4A-4B. For example, the patterned stack 551 may be a fin with alternating layers of nanoribbons 510 and sacrificial layers 547.

In an embodiment, a first mask 591 is disposed over the patterned stack 551 and patterned. The opening in the first mask 591 exposes first regions 510$_A$ of the nanoribbons 510. The first regions 510$_A$ may be doped with dopants 571. For example, the first regions 510$_A$ may be doped with an ion implantation process. In an embodiment, the first regions 510$_A$ may have a first conductivity type. In an embodiment, a dopant concentration of the first regions 510$_A$ may be approximately $10^{19}$ cm$^{-3}$ or less, or between approximately $10^{17}$ cm$^{-3}$ and $10^{19}$ cm$^{-3}$.

Figure 5B:
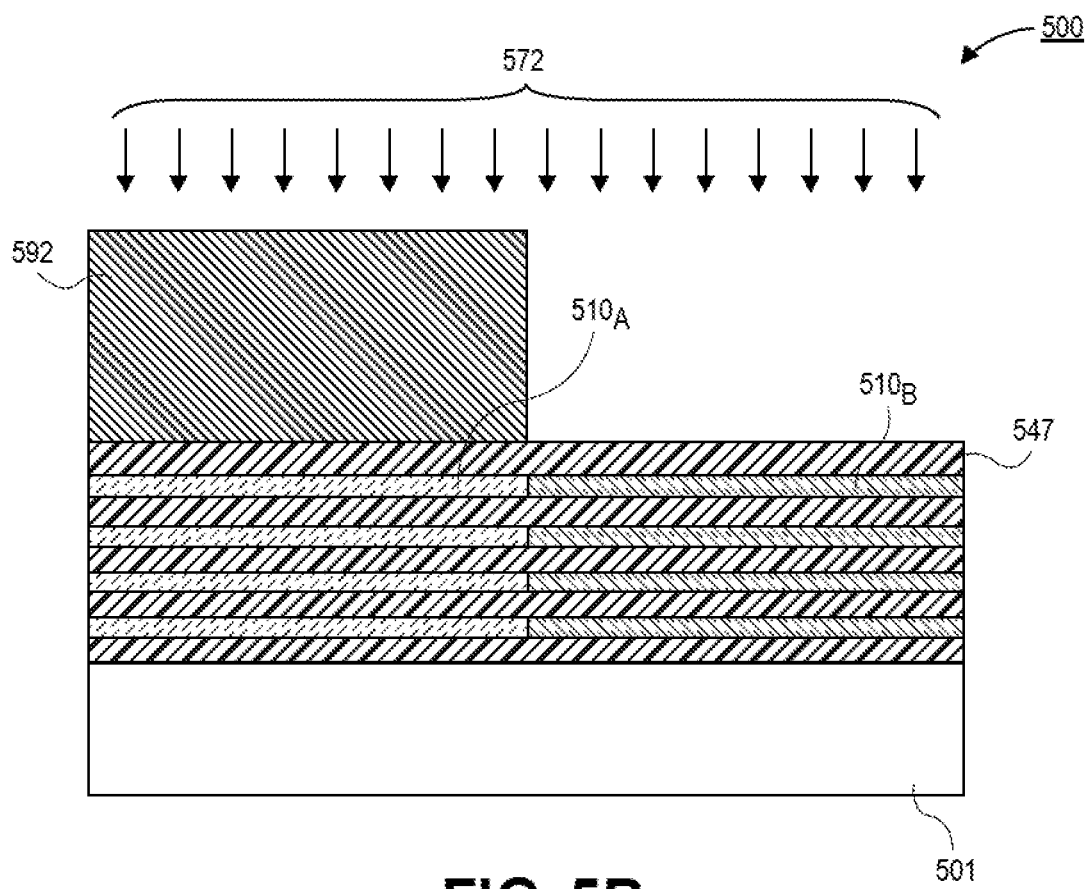

Referring now to FIG. 5B, a cross-sectional illustration of the ESD diode 500 after second regions 510$_B$ are formed is shown, in accordance with an embodiment. In an embodiment, the first mask 591 is removed and a second mask 592 is disposed over the patterned stack 551 and patterned. The opening in the second mask 592 exposes second regions 510$_B$ of the nanoribbons 510. The second regions 510$_B$ may be doped with dopants 572. For example, the second regions 510$_B$ may be doped with an ion implantation process. In an embodiment, the second regions 510$_B$ may have a second conductivity type that is opposite from the first conductivity type. In an embodiment, a dopant concentration of the second regions 510$_B$ may be approximately $10^{19}$ cm$^{-3}$ or less, or between approximately $10^{17}$ cm$^{-3}$ and $10^{19}$ cm$^{-3}$.

Figure 5C:
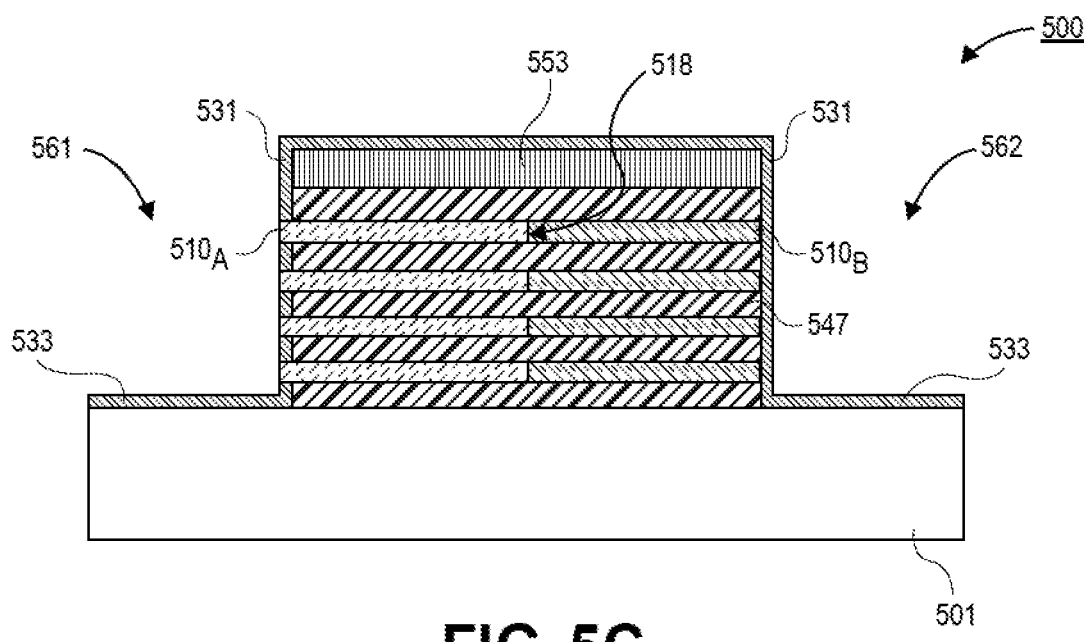

Referring now to FIG. 5C, a cross-sectional illustration of the ESD diode 500 after the second mask 592 is removed and after a sacrificial gate 553 is deposited and a source opening 561 and a drain opening 562 are formed is shown, in accordance with an embodiment. In an embodiment, the sacrificial gate 553 is positioned over the interface 518 between the first regions 510$_A$ and the second regions 510$_B$.

In an embodiment, the source opening 561 and the drain opening 562 are formed along opposite ends of the sacrificial gate 553. In an embodiment, spacers 531 may line the sidewalls of the source opening 561 and the drain opening 562. As shown, the first regions 510$_A$ and the second regions 510$_B$ pass through the spacers 531. Accordingly, there is no low doped region below the spacers, as is the case in the ESD diode 400 described above. In an embodiment, an insulating layer 533 may be disposed over the top surfaces of the substrate 501. The insulating layers 533 may be formed with the spacer etching process, or with other processes not disclosed herein.

Figure 5D:
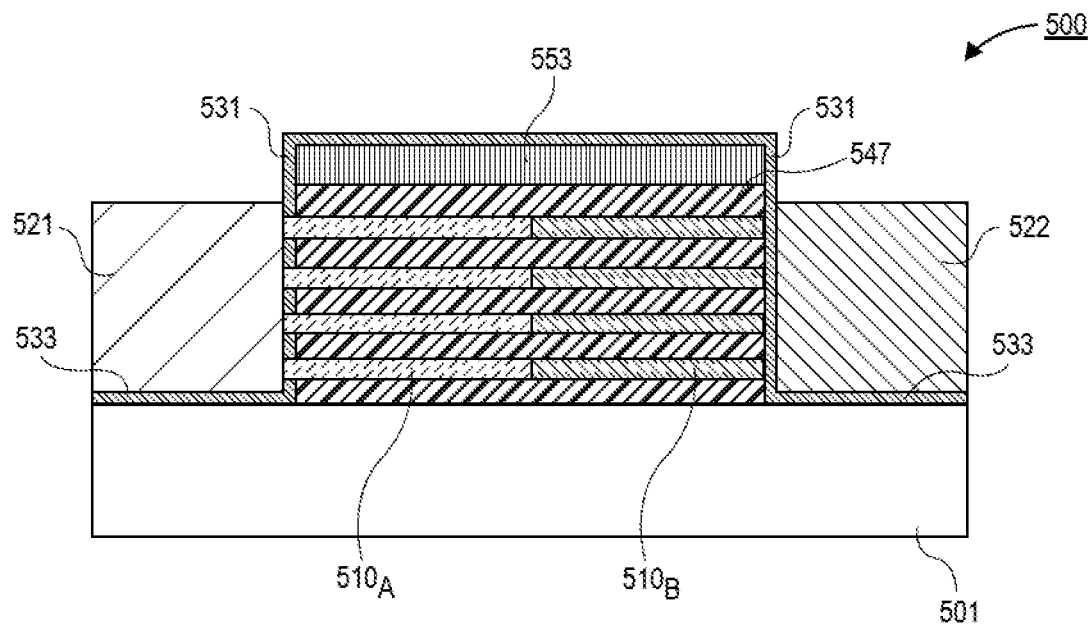

Referring now to FIG. 5D, a cross-sectional illustration of the ESD diode 500 after a source 521 and a drain 522 are disposed in the source opening 561 and the drain opening 562, respectively, is shown, in accordance with an embodiment. In an embodiment, the source 521 and the drain 522 may be grown with epitaxial growth processes similar to those described above with respect to FIGS. 4E and 4F. That is, the source 521 may be grown with a first epitaxial growth process while the drain opening 562 is masked off, and the drain 522 may be grown with a second epitaxial growth process while the source 521 is masked off.

In an embodiment, the source 521 has the first conductivity type and the drain 522 has the second conductivity type. For example, the source 521 may be N-type and the drain 522 may be P-type. In an embodiment, doping concentrations of the source 521 and the drain 522 may be greater than the doping concentrations of the first regions 510$_A$ and the second regions 510$_B$. For example, the doping concentrations of the source 521 and the drain 522 may be approximately $10^{19}$ cm' or greater, or approximately $10^{20}$ cm$^{-3}$ or greater.

Figure 5E:
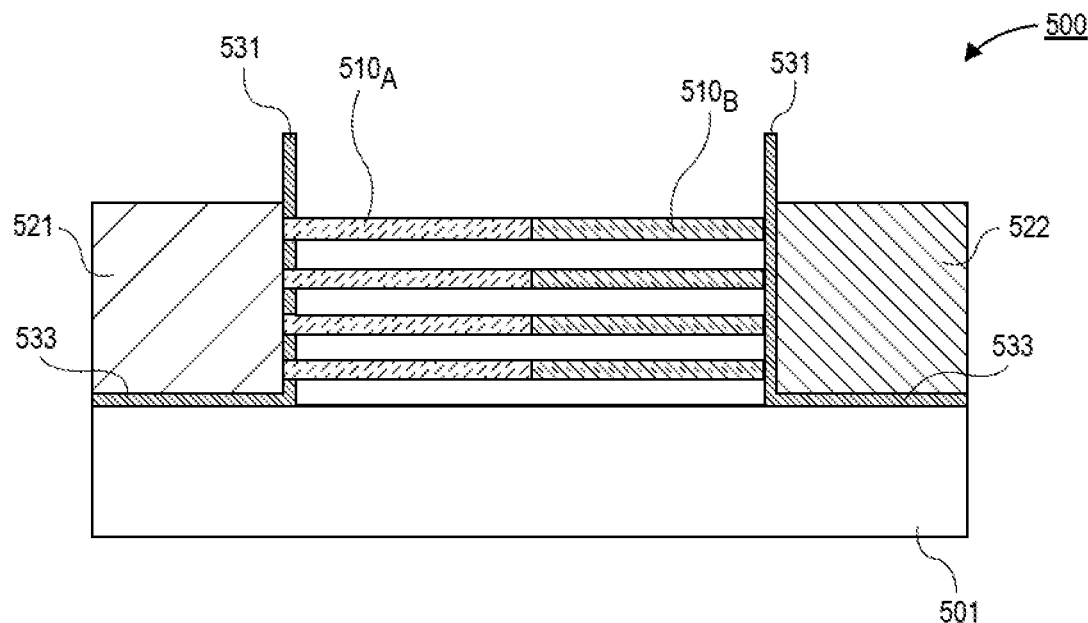

Referring now to FIG. 5E, a cross-sectional illustration of the ESD diode 500 after the sacrificial gate 553 and the sacrificial layers 547 are removed is shown, in accordance with an embodiment. The sacrificial gate 553 may be removed with any suitable etching process. Removal of the sacrificial gate 553 exposes the nanoribbons 510 and the sacrificial layers 547. After removal of the sacrificial gate 553, the sacrificial layers 547 may be removed with an etching process that is selective to the nanoribbons 510. Suitable etching processes are described in greater detail above.

Figure 5F:
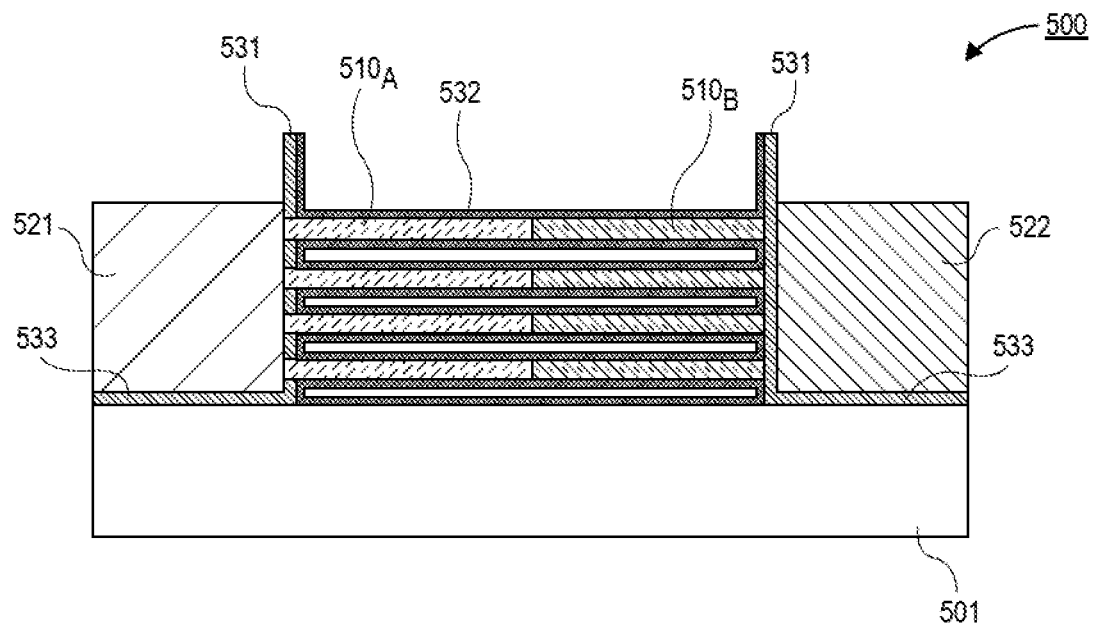

Referring now to FIG. 5F, a cross-sectional illustration of the ESD diode 500 after a gate dielectric 532 is disposed over the first regions 510$_A$ and the second regions 510$_B$ is shown, in accordance with an embodiment. The gate dielectric 532 may be disposed with an ALD process or an oxidation process. A gate dielectric 532 deposited with an ALD process is shown. In an embodiment, the gate dielectric 532 covers the first regions 510$_A$ and the second regions 510$_B$ in addition to being disposed over interior surfaces of the spacers 531.

Figure 5G:
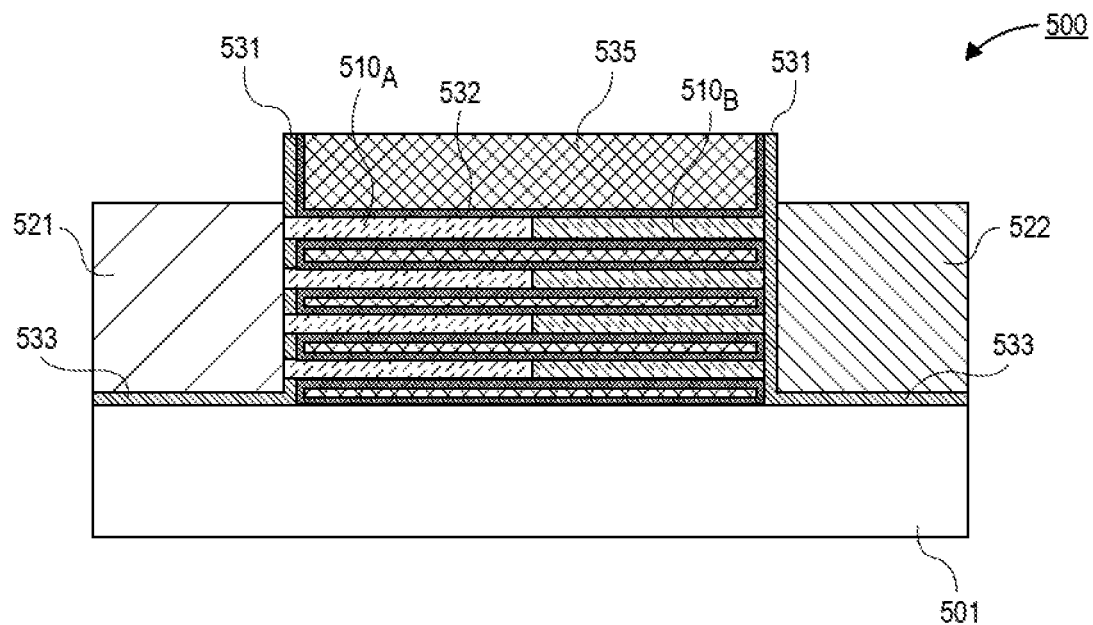

Referring now to FIG. 5G, a cross-sectional illustration of the ESD diode 500 after the dummy gate electrode 535 is disposed over the gate dielectric 532 is shown, in accordance with an embodiment. In an embodiment, the dummy gate electrode 535 may be deposited with any suitable deposition process. In an embodiment, the dummy gate electrode 535 may include a work function metal and a fill metal. The dummy gate electrode 535 is electrically isolated from circuitry external to the ESD diode 500. That is, the dummy gate electrode 535 is a floating electrode.

Figure 6A:
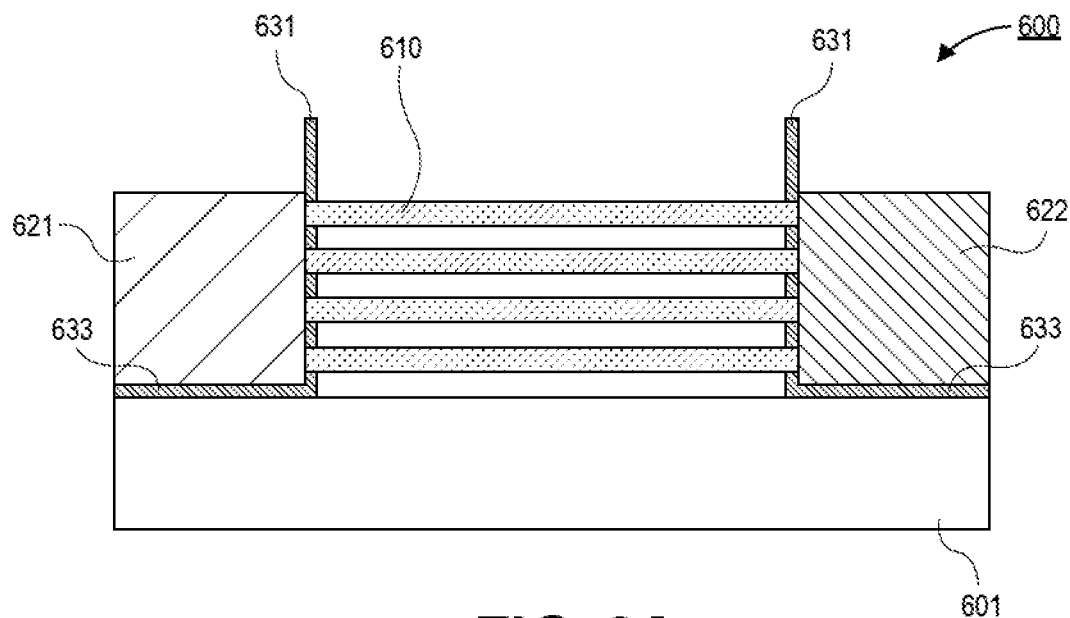
FIGS. 6A-6C are cross-sectional illustrations depicting a process for forming an ESD diode with intrinsic semiconductor nanoribbons, in accordance with an embodiment.
Figure 6B:
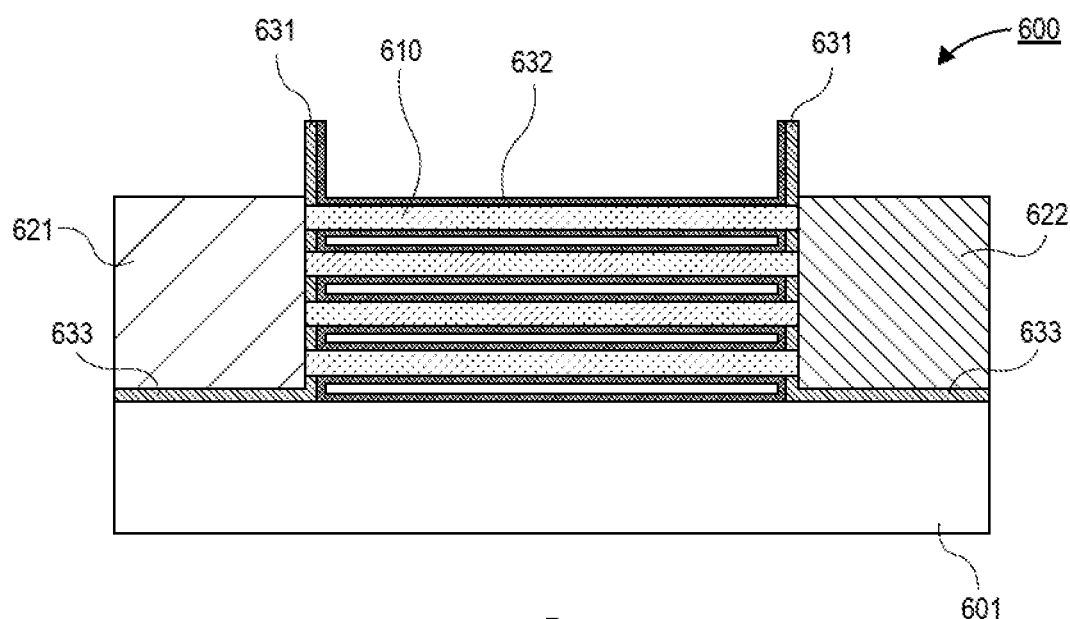
Figure 6C:
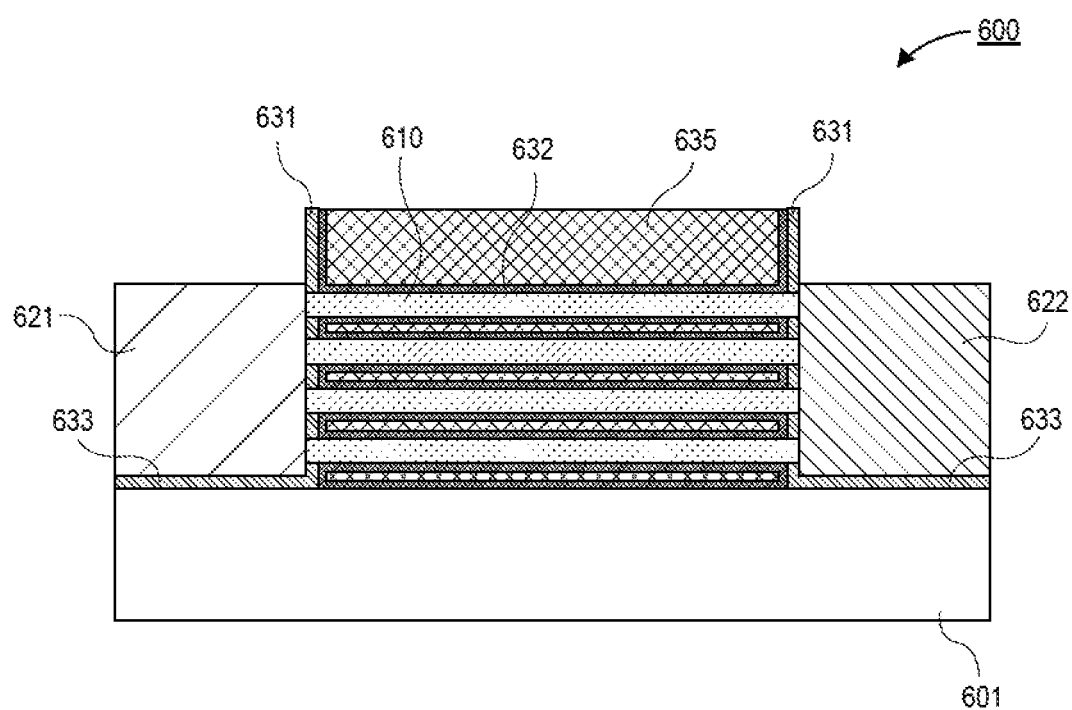

Referring now to FIGS. 6A-6C, a series of cross-sectional illustrations depicting a process for forming a P-I-N ESD diode 600 is shown, in accordance with an embodiment.

Referring now to FIG. 6A, a cross-sectional illustration of an ESD diode 600 is shown, in accordance with an embodiment. The ESD diode 600 illustrated in FIG. 6A may be fabricated using processing operations substantially similar to those described above with respect to FIGS. 4A-4H and will not be repeated here. The fabrication processes result in the formation of an ESD diode 600 over a substrate 601. The ESD diode 600 comprises a source 621, a drain 622, and a plurality of nanoribbons 610 between the source 621 and the drain 622. In an embodiment, the source 621 and the drain 622 may be separated from the substrate 601 by insulating layers 633. In an embodiment, the nanoribbons 610 may pass through spacers 631.

In an embodiment, the source 621 may have a first conductivity type and the drain 622 may have a second conductivity type that is opposite from the first conductivity type. For example, the source 621 may be N-type and the drain 622 may be P-type. In an embodiment, the nanoribbons 610 may be undoped. That is, the nanoribbons 610 may be an intrinsic semiconductor, such as silicon. As such, a P-I-N junction is provided for ESD diode 600.

Referring now to FIG. 6B, a cross-sectional illustration of the ESD diode 600 after a gate dielectric 632 is disposed over the nanoribbons 610 is shown, in accordance with an embodiment. The gate dielectric 632 may be disposed with an ALD process or an oxidation process. A gate dielectric 632 deposited with an ALD process is shown. In an embodiment, the gate dielectric 632 covers the nanoribbons 610 in addition to being disposed over interior surfaces of the spacers 631.

Referring now to FIG. 6C, a cross-sectional illustration of the ESD diode 600 after the dummy gate electrode 635 is disposed over the gate dielectric 632 is shown, in accordance with an embodiment. In an embodiment, the dummy gate electrode 635 may be deposited with any suitable deposition process. In an embodiment, the dummy gate electrode 635 may include a work function metal and a fill metal. The dummy gate electrode 635 is electrically isolated from circuitry external to the ESD diode 600. That is, the dummy gate electrode 635 is a floating electrode.

In an embodiment, the positioning and size of the depletion region of the nanoribbons 610 may be modulated by choosing different materials for the dummy gate electrode 635 and/or the gate dielectric 632. For example, selecting an N-type work function metal for the dummy gate electrode 635 may shift the depletion region towards the drain 622 (similar to the embodiment shown in FIG. 3B), or selecting a P-type work function metal for the dummy gate electrode 635 may shift the depletion region towards the source 621 (similar to the embodiment shown in FIG. 3C).

Figure 7:
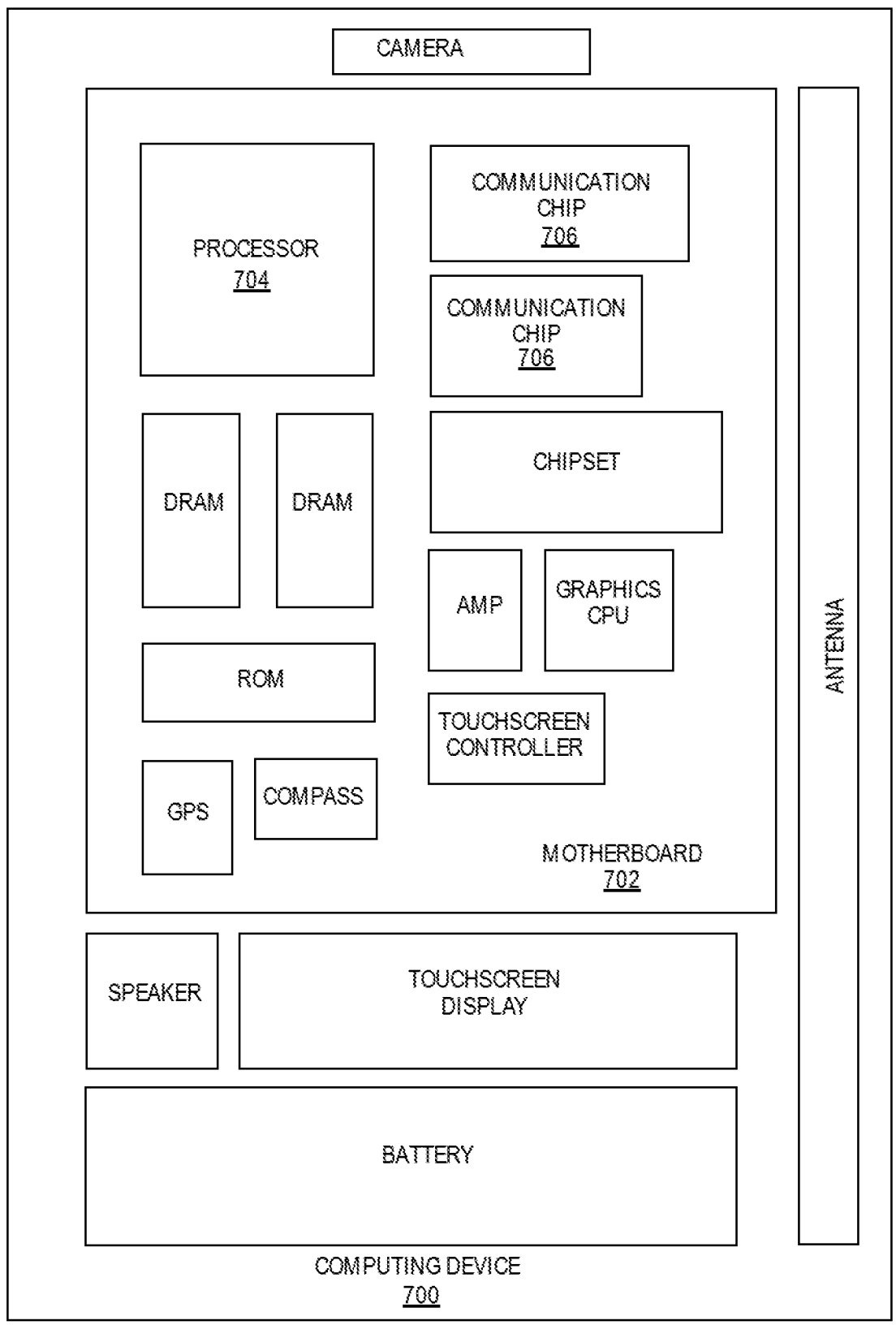
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor 704 may comprise an ESD diode with a nanoribbon architecture, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip 706 may comprise an ESD diode with a nanoribbon architecture, as described herein.

In further implementations, another component housed within the computing device 700 may comprise an ESD diode with a nanoribbon architecture, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
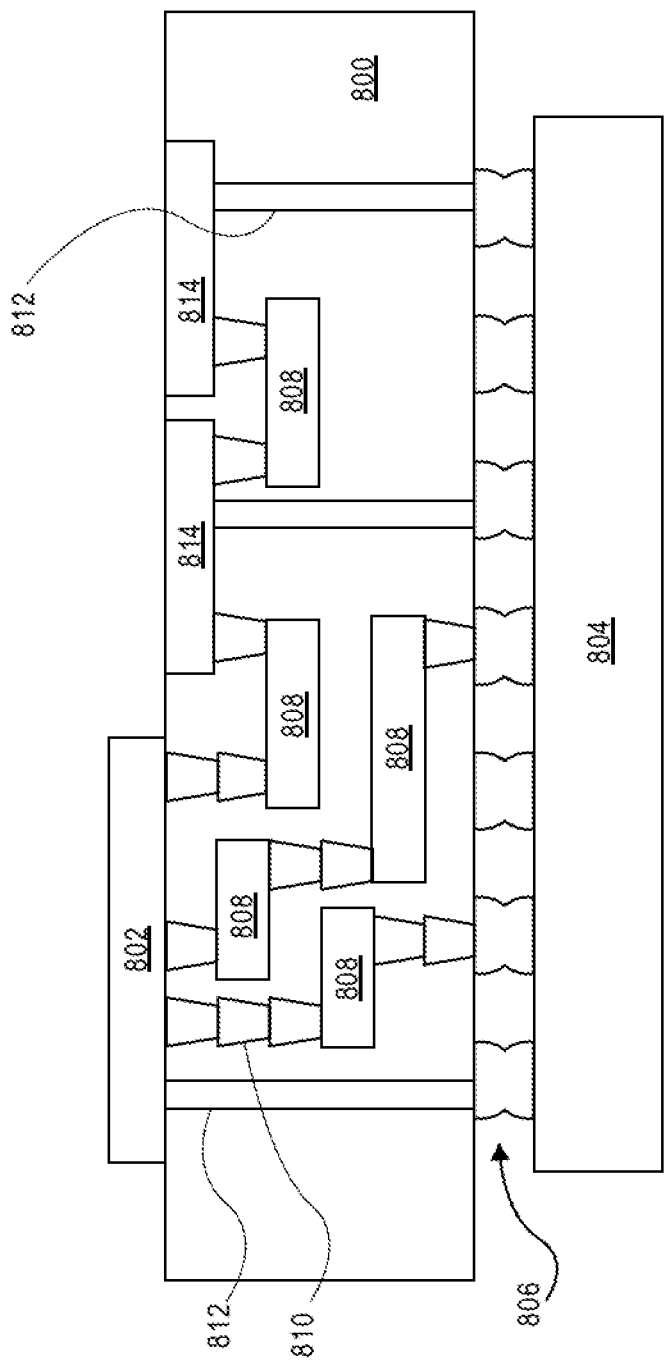
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise an ESD diode with a nanoribbon architecture, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA)

806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise semiconductor devices that comprise an ESD diode with a nanoribbon architecture, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a semiconductor substrate; a source, the source having a first conductivity type, wherein a first insulator separates the source from the semiconductor substrate; a drain, the drain having a second conductivity type that is opposite from the first conductivity type, wherein a second insulator separates the drain from the semiconductor substrate; and a semiconductor body between the source and the drain, wherein the semiconductor body is spaced away from the semiconductor substrate.

Example 2: the semiconductor device of Example 1, wherein the semiconductor body comprises a first region adjacent to the source and a second region adjacent to the drain, and wherein the first region has the first conductivity type and the second region has the second conductivity type.

Example 3: the semiconductor device of Example 2, wherein a first dopant concentration of the first region is less than a second dopant concentration of the source, and wherein a third dopant concentration of the second region is less than a fourth dopant concentration of the drain.

Example 4: the semiconductor device of Example 2 or Example 3, wherein a first length of the first region is equal to a second length of the second region.

Example 5: the semiconductor device of Example 2 or Example 3, wherein a first length of the first region is different than a second length of the second region.

Example 6: the semiconductor device of Examples 1-5, wherein the semiconductor body is an intrinsic semiconductor.

Example 7: the semiconductor device of Examples 1-6, further comprising: a pair of spacers comprising a first spacer adjacent to the source and a second spacer adjacent to the drain, wherein the semiconductor body passes through the pair of spacers.

Example 8: the semiconductor device of Example 7, wherein the first insulator and the second insulator are the same material as the pair of spacers.

Example 9: the semiconductor device of Example 7 or Example 8, further comprising: a dummy gate structure between the pair of spacers, wherein the dummy gate structure comprises: a gate dielectric around the semiconductor body; and a gate electrode around the gate dielectric.

Example 10: the semiconductor device of Example 9, wherein the gate electrode is not electrically connected to circuitry outside of the semiconductor device.

Example 11: the semiconductor device of Examples 7-10, wherein portions of the semiconductor body that pass through the pair of spacers have a first dopant concentration that is lower than a second dopant concentration of portions of the semiconductor body between the pair of spacers.

Example 12: the semiconductor device of Examples 1-11, wherein the semiconductor body is a nanowire or a nanoribbon.

Example 13: an electrostatic discharge (ESD) diode, comprising: a source, wherein the source is a first conductivity type; a drain, wherein the drain is a second conductivity type that is different than the first conductivity type; and a plurality of semiconductor bodies between the source and the drain, wherein a depletion region of the ESD diode is along a length of the plurality of semiconductor bodies.

Example 14: the ESD diode of Example 13, wherein the semiconductor bodies are intrinsic semiconductors.

Example 15: the ESD diode of Example 14, wherein the depletion region is closer to the source than to the drain.

Example 16: the ESD diode of Example 14, wherein the depletion region is closer to the drain than to the source.

Example 17: the ESD diode of Example 14, wherein the depletion region is along an entire length of the plurality of semiconductor bodies.

Example 18: the ESD diode of Examples 13-17, wherein the semiconductor bodies comprise a first region adjacent to the source and a second region adjacent to the drain, wherein the first region has the first conductivity type and the second region has the second conductivity type.

Example 19: the ESD diode of Example 18, wherein the depletion region is substantially equidistant between the source and the drain.

Example 20: the ESD diode of Examples 13-19, further comprising: a dummy gate structure, comprising: a pair of spacers, wherein a first spacer is adjacent to the source and a second spacer is adjacent to the drain; a gate dielectric surrounding the plurality of semiconductor bodies; and a gate electrode surrounding the gate dielectric.

Example 21: a method of forming a semiconductor device, comprising: forming a fin comprising a stack of alternating semiconductor bodies and sacrificial layers; forming a sacrificial gate structure over the fin; forming a source opening and a drain opening on opposite ends of the fin; disposing a source in the source opening, wherein the source has a first conductivity type; disposing a drain in the drain opening, wherein the drain has a second conductivity type; removing the sacrificial gate structure; removing the sacrificial layers; and disposing a dummy gate structure over the semiconductor bodies.

Example 22: the method of Example 21, further comprising: doping a first region of the semiconductor bodies with dopants of the first conductivity type, wherein the first region is adjacent to the source; and doping a second region of the semiconductor bodies with dopants of the second conductivity type, wherein the second region is adjacent to the drain.

Example 23: the method of Example 21 or Example 22, further comprising: an insulator between a surface of the source and an underlying substrate and between a surface of the drain and the underlying substrate.

Example 24: an electronic device, comprising: a board; an electronic package electrically coupled to the board; and a die electrically coupled to the electronic package, wherein the die comprises: a semiconductor substrate; a source, the source having a first conductivity type, wherein a first insulator separates the source from the semiconductor substrate; a drain, the drain having a second conductivity type that is opposite from the first conductivity type, wherein a second insulator separates the drain from the semiconductor substrate; and a semiconductor body between the source and the drain, wherein the semiconductor body is spaced away from the semiconductor substrate.

Example 25: the electronic device of Example 24, wherein the semiconductor body is a nanowire or a nanoribbon.

What is claimed is:

1. A semiconductor device, comprising:
a semiconductor substrate;
a source, the source having a first conductivity type, wherein a first insulator separates the source from the semiconductor substrate;
a drain, the drain having a second conductivity type that is opposite from the first conductivity type, wherein a second insulator separates the drain from the semiconductor substrate; and
a semiconductor body between the source and the drain, wherein the semiconductor body is spaced away from the semiconductor substrate, wherein the semiconductor body comprises a first region adjacent to the source and a second region adjacent to the drain, the first region in physical contact with the second region and wherein the first region has the first conductivity type and the second region has the second conductivity type, and wherein a portion of the first region that has the first conductivity type is in direct physical contact with a portion of the second region that has the second conductivity type.

2. The semiconductor device of claim 1, wherein a first dopant concentration of the first region is less than a second dopant concentration of the source, and wherein a third dopant concentration of the second region is less than a fourth dopant concentration of the drain.

3. The semiconductor device of claim 1, wherein a first length of the first region is equal to a second length of the second region.

4. The semiconductor device of claim 1, further comprising:
a pair of spacers comprising a first spacer adjacent to the source and a second spacer adjacent to the drain, wherein the semiconductor body passes through the pair of spacers.

5. The semiconductor device of claim 4, wherein the first insulator and the second insulator are the same material as the pair of spacers.

6. The semiconductor device of claim 4, further comprising:
a dummy gate structure between the pair of spacers, wherein the dummy gate structure comprises:
a gate dielectric around the semiconductor body; and
a gate electrode around the gate dielectric.

7. The semiconductor device of claim 6, wherein the gate electrode is not electrically connected to circuitry outside of the semiconductor device.

8. The semiconductor device of claim 1, wherein the semiconductor body is a nanowire or a nanoribbon.

9. An electrostatic discharge (ESD) diode, comprising:
a source, wherein the source is a first conductivity type;
a drain, wherein the drain is a second conductivity type that is different than the first conductivity type; and
a plurality of semiconductor bodies between the source and the drain, wherein a depletion region of the ESD diode is along a length of the plurality of semiconductor bodies, wherein the semiconductor bodies comprise a first region adjacent to the source and a second region adjacent to the drain, the first region in physical contact with the second region, and wherein the first region has the first conductivity type and the second region has the second conductivity type, and wherein a portion of the first region that has the first conductivity type is in direct physical contact with a portion of the second region that has the second conductivity type.

10. The ESD diode of claim 9, wherein the depletion region is substantially equidistant between the source and the drain.

11. The ESD diode of claim 9, further comprising:
a dummy gate structure, comprising:
a pair of spacers, wherein a first spacer is adjacent to the source and a second spacer is adjacent to the drain;
a gate dielectric surrounding the plurality of semiconductor bodies; and
a gate electrode surrounding the gate dielectric.

* * * * *